United States Patent
Kim et al.

(10) Patent No.: US 8,941,157 B2
(45) Date of Patent: Jan. 27, 2015

(54) SEMICONDUCTOR DEVICE AND METHOD FOR FABRICATING THE SAME

(71) Applicant: SK Hynix Inc., Gyeonggi-do (KR)

(72) Inventors: Hyung-Hwan Kim, Gyeonggi-do (KR); Seong-Su Lim, Gyeonggi-do (KR); Sung-Eun Park, Gyeonggi-do (KR); Seung-Seok Pyo, Gyeonggi-do (KR); Min-Cheol Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/251,210

(22) Filed: Apr. 11, 2014

(65) Prior Publication Data

US 2014/0217545 A1 Aug. 7, 2014

Related U.S. Application Data

(62) Division of application No. 13/101,424, filed on May 5, 2011, now Pat. No. 8,697,525.

(30) Foreign Application Priority Data

Dec. 31, 2010 (KR) .......................... 10-2010-0140493

(51) Int. Cl.
*H01L 29/76* (2006.01)
*H01L 29/06* (2006.01)
*H01L 21/768* (2006.01)
*H01L 23/522* (2006.01)
*H01L 23/532* (2006.01)
*H01L 27/108* (2006.01)

(52) U.S. Cl.
CPC ........ *H01L 29/0649* (2013.01); *H01L 21/7682* (2013.01); *H01L 21/76897* (2013.01); *H01L 23/5222* (2013.01); *H01L 23/53295* (2013.01); *H01L 27/10855* (2013.01); *H01L 27/10885* (2013.01)
USPC ........................................................ 257/288

(58) Field of Classification Search
USPC ............................................ 257/288, E21.64
See application file for complete search history.

(56) References Cited

U.S. PATENT DOCUMENTS 8,421,166 B2 * 4/2013 Chi et al. ..................... 257/410

OTHER PUBLICATIONS machine translation of KR 1020010011638.*

* cited by examiner

*Primary Examiner* — Bradley K Smith
(74) *Attorney, Agent, or Firm* — IP & T Group LLP

(57) ABSTRACT

A semiconductor device includes a plurality of first conductive patterns separated by a damascene pattern, a second conductive pattern buried in the damascene pattern, and a spacer including an air gap between the second conductive pattern and the first conductive patterns.

7 Claims, 27 Drawing Sheets

SEMICONDUCTOR DEVICE AND METHOD FOR FABRICATING THE SAME

CROSS-REFERENCE TO RELATED APPLICATIONS

This application is a division of U.S. patent application Ser. No. 13/101,424 filed on May 5, 2011, which claims priority of Korean Patent Application No. 10-2010-0140493, filed on Dec. 31, 2010, which is incorporated herein by reference in its entirety.

BACKGROUND OF THE INVENTION

Exemplary embodiments of the present invention relate to a method for fabricating a semiconductor device, and more particularly, to a semiconductor device that may decrease parasitic capacitance between bit lines and storage node contact plugs and a method for fabricating the semiconductor device.

In a semiconductor device such as a Dynamic Random Access Memory (DRAM) device, a capacitor and a bit line perform an electrical operation through a source/drain contact. As semiconductor devices shrink, storage node contact plugs (SNC) and bit lines (or bit line contacts) have to be formed within a small area. In this case, the storage node contact plugs and the bit lines are laid adjacent to each other with a thin spacer between them. The spacer is typically a nitride layer, such as a silicon nitride layer.

Generally, a silicon nitride layer has a high dielectric rate and thus it is not effective in suppressing the parasitic capacitance (Cb) between bit lines and storage node contact plugs.

Therefore, the parasitic capacitance between bit lines and storage node contact plugs may increase, and an increase in the parasitic capacitance decreases a sensing margin.

SUMMARY OF THE INVENTION

Exemplary embodiments of the present invention are directed to a semiconductor device that may decrease the parasitic capacitance between bit lines and storage node contact plugs, and a method for fabricating the semiconductor device.

In accordance with an exemplary embodiment of the present invention, a semiconductor device includes a plurality of first conductive patterns separated by a damascene pattern, a second conductive pattern buried in the damascene pattern, and a spacer comprising an air gap between the second conductive pattern and the first conductive patterns.

The semiconductor device may further include a capping layer configured to hermetically seal an upper portion of the air gap. The spacer may include a silicon nitride layer. The spacer may include a first spacer and a second spacer, and the air gap may be disposed between the first spacer and the second spacer. The first spacer and the second spacer may include a silicon nitride layer. The first spacer may include a silicon nitride layer and the second spacer may comprise an oxide layer.

In accordance with another exemplary embodiment of the present invention, a method for forming a semiconductor device includes forming a first conductive layer, forming a damascene pattern and first conductive patterns by etching the first conductive layer, forming a spacer on sidewalls of the damascene pattern, forming a second conductive pattern buried in the damascene pattern, and forming an air gap between the first conductive patterns and the second conductive pattern by etching a portion of the spacer.

The forming of the spacer may comprise forming multiple spacers comprising a sacrificial spacer selected from the group consisting of a titanium nitride layer, an aluminum oxide layer, and a silicon layer, and the air gap may be formed by removing the sacrificial spacer.

In accordance with another exemplary embodiment of the present invention, a method for forming a semiconductor device includes forming a first conductive layer, forming a damascene pattern and first conductive patterns by etching the first conductive layer, forming a dual spacer, comprising a sacrificial spacer and a spacer, on sidewalls of the damascene pattern, forming a second conductive pattern buried in the damascene pattern, and forming an air gap by etching the sacrificial spacer.

The sacrificial spacer may be a titanium nitride layer, and the spacer may be a silicon nitride layer. The sacrificial spacer may be an aluminum oxide layer or a silicon layer, and the spacer may be a silicon nitride layer.

In the forming of the dual spacer, the sacrificial spacer may be formed by oxidizing a sidewall of the first conductive patterns exposed by the damascene pattern. The first conductive patterns may include a tungsten layer, and the sacrificial spacer may comprise a tungsten oxide layer.

In accordance with another exemplary embodiment of the present invention, a method for forming a semiconductor device includes forming a first conductive layer, forming a damascene pattern and first conductive patterns by etching the first conductive layer, forming a triple spacer, comprising a first spacer, a sacrificial spacer, and a second spacer, on sidewalls of the damascene pattern, forming a second conductive pattern buried in the damascene pattern, and forming an air gap by etching the sacrificial spacer.

The sacrificial spacer may include any one selected from the group consisting of a titanium nitride layer, an aluminum oxide layer, and a silicon layer. The first spacer may include a silicon oxide layer, and the sacrificial spacer may comprise a titanium nitride layer, and the second spacer may comprise a silicon nitride layer. The first spacer may include a silicon nitride layer, and the sacrificial spacer may comprise a titanium nitride layer, and the second spacer may comprise a silicon nitride layer. The first spacer may include a tungsten oxide layer, and the sacrificial spacer may comprise a titanium nitride layer, and the second spacer may comprise a silicon nitride layer.

The first conductive patterns may include storage node contact plugs, and the second conductive pattern may comprise a bit line. The storage node contact plugs may include a polysilicon layer or a tungsten layer.

DESCRIPTION OF SPECIFIC EMBODIMENTS

Figure 1A:
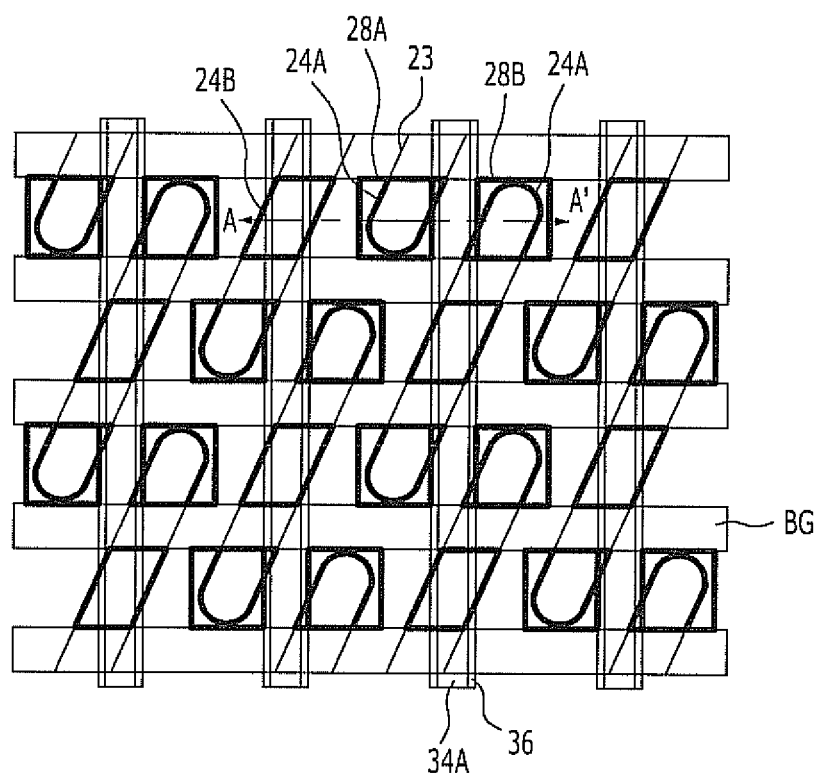
FIG. 1A is a plan view of a semiconductor device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 1B:
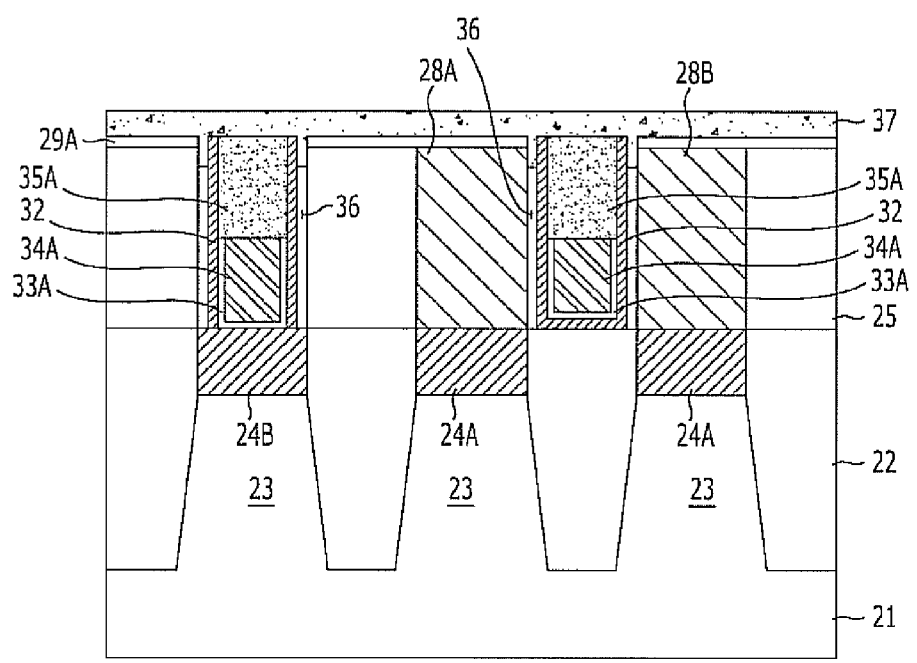
FIG. 1B is a cross-sectional view of the semiconductor device of FIG. 1A taken along a line A-A'.

FIG. 1A is a plan view of a semiconductor device in accordance with a first exemplary embodiment of the present invention, and FIG. 1B is a cross-sectional view of the semiconductor device of FIG. 1A taken along a line A-A'.

Referring to FIGS. 1A and 1B, an isolation layer 22 is formed over a semiconductor substrate 21. The isolation layer 22 defines active regions 23. First landing plugs 24A and a second landing plug 24B are formed over the active regions 23. Over the first landing plugs 24A, storage node contact plugs 28A and 28B are formed. Over the second landing plug 24B, bit lines 34A are formed. The bit lines 34A isolate the storage node contact plugs 28A and 28B from each other. The storage node contact plugs 28A and 28B are formed as the bit lines 34A isolate dual storage node contact plugs. The bit lines 34A are formed by etching an inter-layer insulation layer 25 to thereby form a damascene pattern and then filling the inside of the damascene pattern. Therefore, the bit lines 34A are referred to as damascene bit lines. The damascene pattern separates the dual storage node contact plugs into storage node contact plugs 28A and 28B. A bit line hard mask layer pattern 35A is formed over the bit lines 34A. A barrier layer 33A is formed on the sidewalls and bottom surface of each bit line 34A. An air gap 36 and a spacer 32 are formed between the bit lines 34A and the storage node contact plugs 28A and 28B. The spacer 32 may be a nitride layer such as a silicon nitride layer. The storage node contact plugs 28A and 28B may be a polysilicon layer. A hard mask pattern 29A is formed on the upper portion of the storage node contact plugs 28A and 28B and the inter-layer insulation layer 25. A capping layer 37 hermetically sealing the upper portion of the air gap 36 is also formed. In the drawing, a reference symbol 'BG' shown in FIG. 1A denotes a buried gate.

According to the first exemplary embodiment of the present invention described above, the air gap 36 and the spacer 32 are between the storage node contact plugs 28A and 28B and the bit lines 34A. The parasitic capacitance between the storage node contact plugs 28A and 28B and the bit lines 34A may be decreased by forming the air gap 36 between the storage node contact plugs 28A and 28B and the bit lines 34A.

FIGS. 2A to 2K are cross-sectional views taken along a line A-A' of FIG. 1A to illustrate a method for fabricating a semiconductor device in accordance with the first exemplary embodiment of the present invention.

Figure 2A:
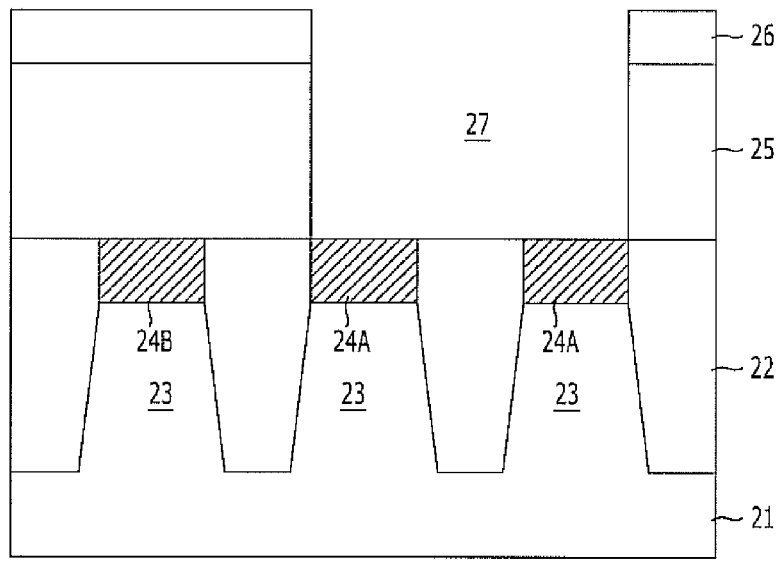
FIGS. 2A to 2K are cross-sectional views illustrating a method for fabricating a semiconductor device in accordance with the first exemplary embodiment of the present invention.

Referring to FIG. 2A, the isolation layer 22 is formed over the semiconductor substrate 21. The isolation layer 22 is formed through a well-known Shallow Trench Isolation (STI) process. The isolation layer 22 defines the active regions 23. Although not illustrated in FIG. 2A, a process for forming buried gates (BG) may be performed after the isolation layer 22 is formed. The buried gates BG are not shown in FIG. 2A because they are not viewable from a cross-section view taken along the line A-A'. However, it should be understood that the buried gates may be formed through a conventional method for forming buried gates.

Subsequently, first landing plugs 24A to be coupled with storage node contact plugs and a second landing plug 24B to be coupled with a bit line are formed on the surface of the active regions 23. The first landing plugs 24A and the second landing plug 24B may be formed to be self-aligned to the isolation layer 22. The first landing plugs 24A and the second landing plug 24B may be formed of a polysilicon layer.

According to another exemplary embodiment, the first landing plugs 24A and the second landing plug 24B may be formed prior to the isolation layer 22. For example, the first landing plugs 24A and the second landing plug 24B may be formed by forming a conductive layer to be used as the first landing plugs 24A and the second landing plug 24B, and then etching the conductive layer through an STI process. Subsequently, trenches are formed by using the first landing plugs 24A and the second landing plug 24B as etch barriers and etching the semiconductor substrate 21. Then, the isolation layer 22 can be formed by filling the trenches.

Returning to the exemplary embodiment of FIG. 2A, after forming the first landing plugs 24A and the second landing plug 24B, the inter-layer insulation layer 25 is formed over the resultant substrate structure. The inter-layer insulation layer 25 may be an oxide layer, such as BPSG (Boron Phosphorus Silicate Glass).

Next, the inter-layer insulation layer 25 is etched by using a storage node contact mask 26 as an etch barrier. As a result, dual storage node contact holes 27 are formed. Each of the dual storage node contact holes 27 simultaneously opens the first landing plugs 24A on the upper portions of neighboring active regions 23.

Figure 2B:
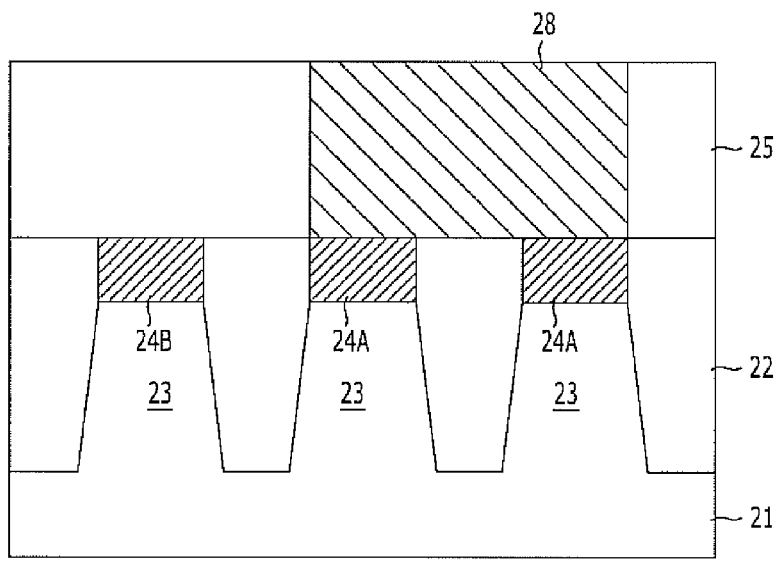

Referring to FIG. 2B, the storage node contact mask 26 is removed, and then a dual storage node contact plug 28 filling the dual storage node contact holes 27 is formed. The dual storage node contact plug 28 is formed by depositing a polysilicon layer and performing a Chemical Mechanical Polishing (CMP) or an etch-back process.

Figure 2C:
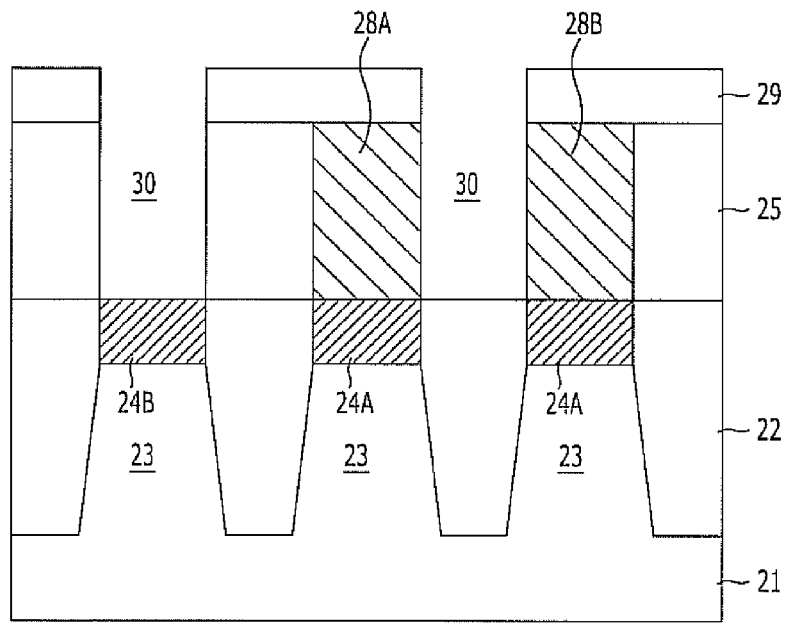

Referring to FIG. 2C, a damascene mask 29 is formed. The damascene mask 29 is a mask designed to separate the dual storage node contact plug 28 and to form a damascene pattern where bit lines are subsequently formed. The damascene mask 29 may be a photoresist pattern or a hard mask pattern. Hereafter, the damascene mask 29 is referred to as a hard mask pattern 29. The hard mask pattern 29 may be a nitride layer, such as a silicon nitride layer.

The dual storage node contact plug 28 and the inter-layer insulation layer 25 are etched by using the hard mask pattern 29 as an etch barrier. As a result, a damascene pattern 30 is formed, and the storage node contact plugs 28A and 28B that are independent from each other due to the damascene pattern 30 are formed. Also, the damascene pattern 30 exposes the second landing plug 24B and the isolation layer 22. The damascene pattern 30 may be formed by etching the dual storage node contact plug 28 first and then etching the inter-layer insulation layer 25. Alternatively, it is possible to form the damascene pattern 30 by etching the inter-layer insulation layer 25 first and then etching the dual storage node contact plug 28 or by simultaneously etching the inter-layer insulation layer 25 and the dual storage node contact plug 28.

Figure 2D:
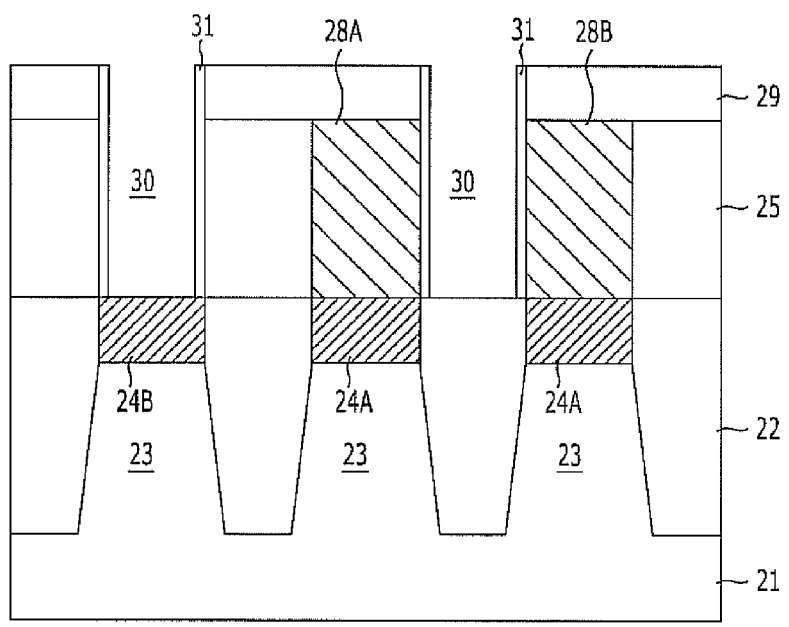

Referring to FIG. 2D, a sacrificial spacer 31 is formed on the sidewalls of the damascene pattern 30. The sacrificial spacer 31 may be a titanium nitride (TiN) layer. The sacrificial spacer 31 may be formed by depositing a first spacer layer (e.g., a titanium nitride (TiN) layer) over the substrate structure including the damascene pattern 30, and then performing an etch-back process to remove portions (e.g., horizontal surfaces) of the first spacer layer.

Figure 2E:
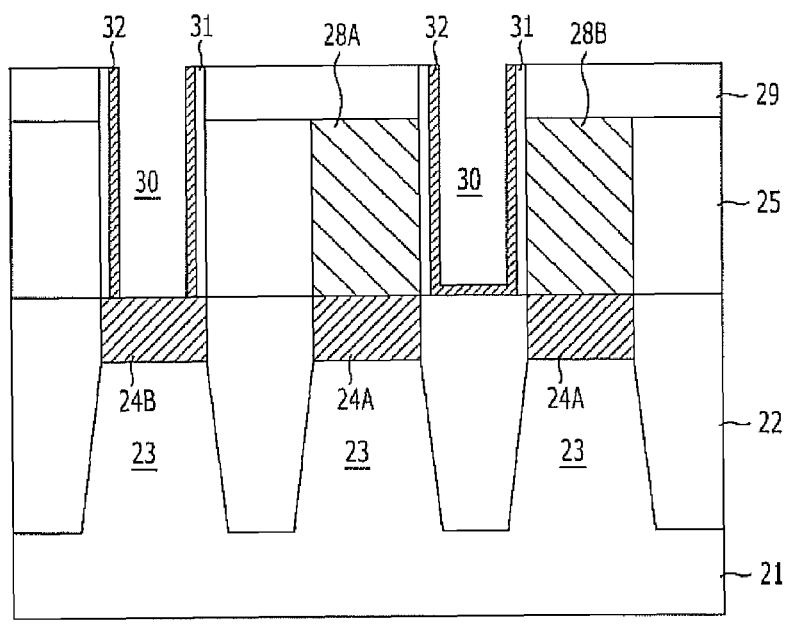

Referring to FIG. 2E, the spacer 32 is formed on the sidewalls of the sacrificial spacer 31. The spacer 32 may be a nitride layer, such as a silicon nitride layer. The spacer 32 may be formed by depositing a second spacer layer (e.g., a nitride layer) over the substrate structure including the damascene pattern 30 with the sacrificial spacer 31, and then performing an etch-back process to remove portions (e.g., select horizontal surfaces) of the second spacer layer.

As described above, the spacer 32 covers the sidewalls of the sacrificial spacer 31, and thus, a dual spacer, including the sacrificial spacer 31 and the spacer 32, is formed on the sidewalls of the damascene pattern 30. Where the sacrificial spacer 31 is a titanium nitride layer, and the spacer 32 is a nitride layer, the dual spacer has a structure of TiN—$Si_3N_4$ (which is TiN—N, hereafter).

The spacer 32 formed on the sidewalls of the storage node contact plugs 28A and 28B may remain on the bottom surface. The remaining spacer 32 prevents a short from occurring between a damascene bit line and the first landing plugs 24A. An additional mask is used to make the spacer 32 remain on the bottom surface between the storage node contact plugs 28A and 28B. The additional mask is a bit line contact mask that is patterned to selectively expose the second landing plug 24B. The spacer 32 provides a bit line contact which exposes the surface of the second landing plug 24B. Accordingly, the spacer 32 becomes a bit line spacer.

Figure 2F:
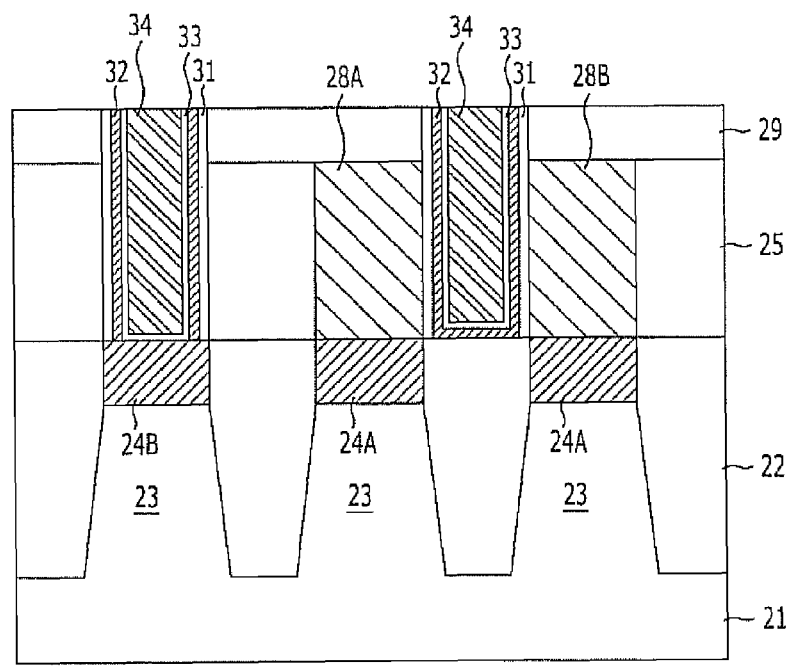

Referring to FIG. 2F, a conductive layer is formed over the substrate structure to fill the damascene pattern 30 with the spacer 32 formed therein. Subsequently, the conductive layer remains inside the damascene pattern 30 by performing an isolation process such as Chemical Mechanical Polishing (CMP). As a result of the CMP process, the upper portion of the sacrificial spacer 31 is exposed. The conductive layer includes a barrier layer 33 and a bit line conductive layer 34. The bit line conductive layer 34 may be formed of metal such as tungsten. The barrier layer 33 may be a titanium nitride (TiN) layer.

As described above, when the conductive layer, including the barrier layer 33 and the bit line conductive layer 34, is formed, the sacrificial spacer 31 and the spacer 32 remain between the conductive layer and the storage node contact plugs 28A and 28B. The sacrificial spacer 31 contacts the storage node contact plugs 28A and 28B, and the spacer 32 contacts the barrier layer 33.

Figure 2G:
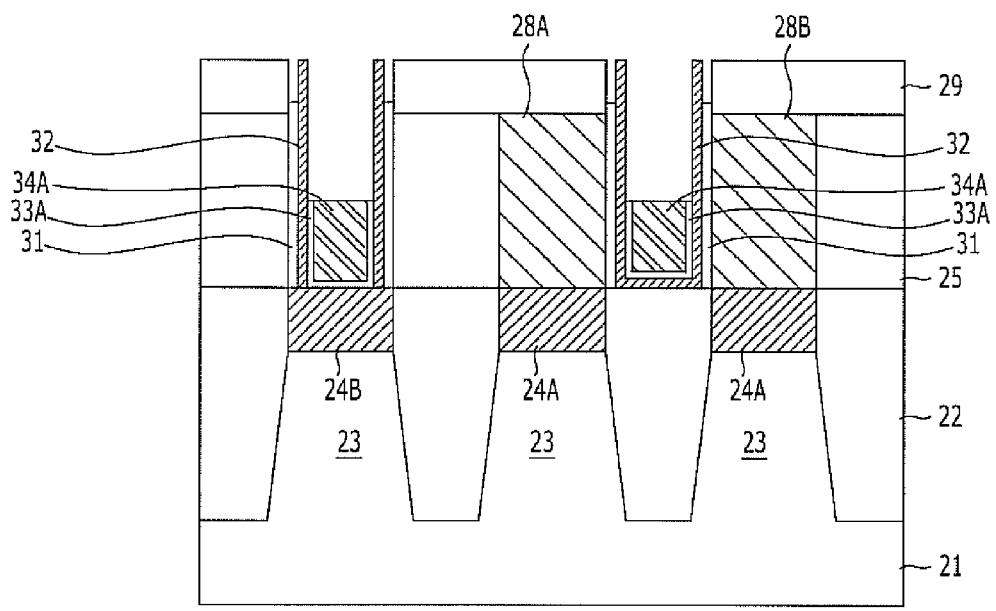

Referring to FIG. 2G, the bit line conductive layer 34 is recessed to a certain depth. As a result, the bit lines 34A partially filling the inside of the damascene pattern 30 are formed. The bit lines 34A become damascene bit lines. When the bit line conductive layer 34 is recessed, the barrier layer 33 is simultaneously recessed as well. As a result, a barrier layer pattern 33A remains on the external walls and bottom surface of the bit lines 34A.

When the bit line conductive layer 34 is recessed, an etch-back process is performed. During the etch-back process, the sacrificial spacer 31 may be recessed to a certain depth. For example, when the barrier layer 33 and the sacrificial spacer 31 are formed of the same material, the upper portion of the sacrificial spacer 31 is removed forming another opening that extends to a certain depth between the spacer 32 and the hard mask pattern 29.

Figure 2H:
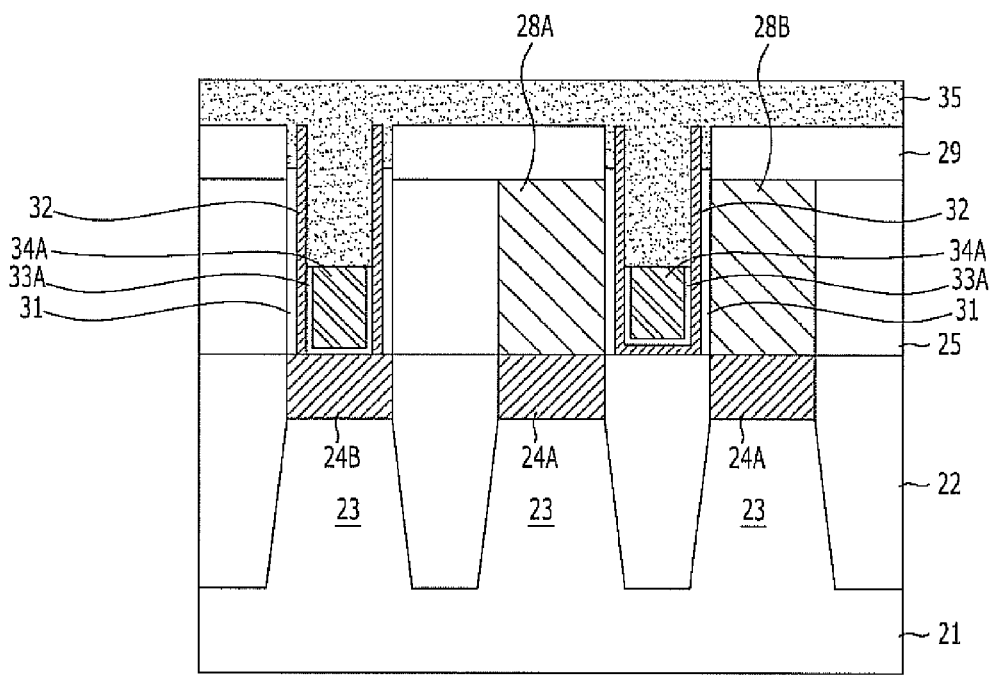

Referring to FIG. 2H, a bit line hard mask layer 35 is formed over the substrate structure including the bit lines 34A. The bit line hard mask layer 35 may be a nitride layer such as a silicon nitride layer. The bit line hard mask layer 35 gap-fills the upper portion of the bit lines 34A, and also, gap-fills the upper portion of the sacrificial spacer 31.

Figure 2I:
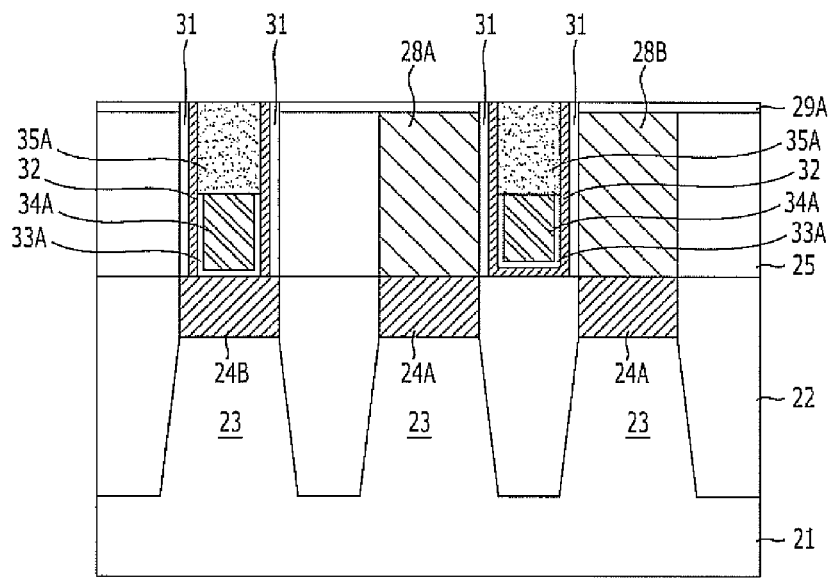

Referring to FIG. 2I, the bit line hard mask layer 35 is planarized. Herein, the planarization of the bit line hard mask layer 35 is performed targeting the upper portion of the sacrificial spacer 31 so that the upper portion of the sacrificial spacer 31 is exposed. The planarization may be performed using a CMP process. As a result of the planarization, the bit line hard mask layer pattern 35A remains on the upper portion of the bit lines 34A. Also, a portion of the hard mask pattern 29 is planarized. The remaining hard mask pattern 29 is denoted with reference numeral 29A.

Figure 2J:
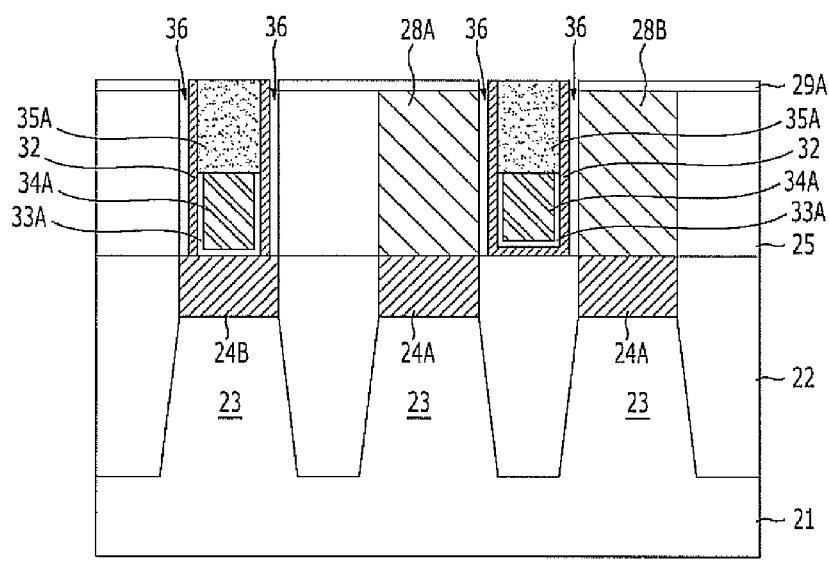

Referring to FIG. 2J, the sacrificial spacer 31 is selectively removed. As a result, the air gap 36 is formed between the storage node contact plugs 28A and 28B and the bit lines 34A. The sacrificial spacer 31 may be removed through a wet etch process or a dry etch process. When the sacrificial spacer 31 is removed, the spacer 32, the storage node contact plugs 28A and 28B, the bit lines 34A, the bit line hard mask layer pattern 35A, and the inter-layer insulation layer 25 are not damaged due to etch selectivity. The storage node contact plugs 28A and 28B and the inter-layer insulation layer 25 are protected by the hard mask pattern 29A, and therefore, they are not removed when the sacrificial spacer 31 is removed.

When the sacrificial spacer 31 is a titanium nitride layer, a wet cleaning process using a mixed solution of sulfuric acid ($H_2SO_4$) and hydrogen peroxide ($H_2O_2$) is performed. This is referred to as a 'CLN_B' cleaning.

Figure 2K:
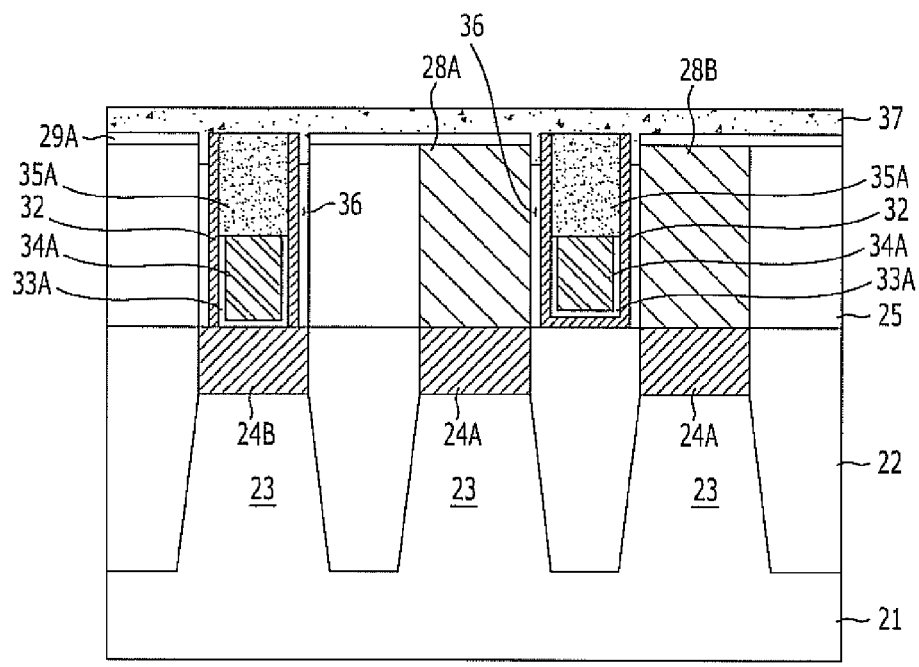

Referring to FIG. 2K, the capping layer 37 is formed over the substrate structure. The capping layer 37 prevents the lifting of the bit lines 34A due to the air gap 36. The capping layer 37 may be a nitride layer such as a silicon nitride layer. The capping layer 37 hermetically seals the upper portion of the air gap 36.

According to the first exemplary embodiment of the present invention, the air gap 36 and the spacer 32 are between the storage node contact plugs 28A and 28B and the bit lines 34A. Since the air gap 36 is formed between the storage node contact plugs 28A and 28B and the bit lines 34A, the parasitic capacitance between the storage node contact plugs 28A and 28B and the bit lines 34A is decreased.

Figure 3:
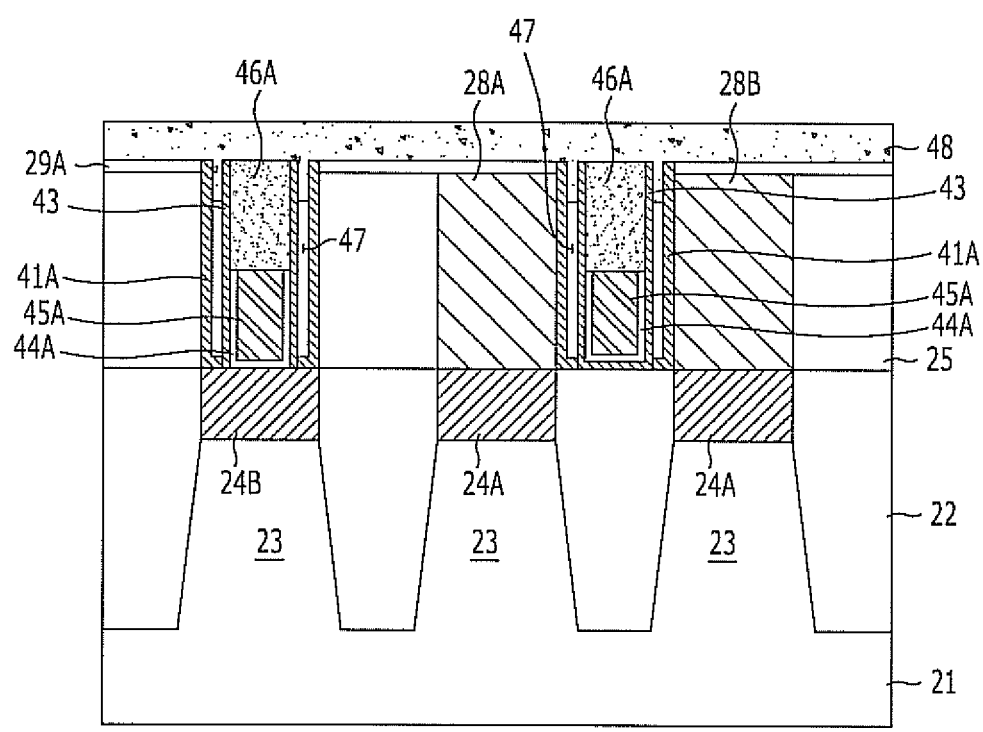
FIG. 3 is a cross-sectional view of a semiconductor device in accordance with a second exemplary embodiment of the present invention.

FIG. 3 is a cross-sectional view of a semiconductor device in accordance with a second exemplary embodiment of the present invention.

Referring to FIG. 3, the isolation layer 22 is formed over the semiconductor substrate 21. The isolation layer 22 defines active regions 23. First landing plugs 24A and a second landing plug 24B are formed over the active regions 23. Over the first landing plugs 24A, storage node contact plugs 28A and 28B are formed. Over the second landing plug 24B, bit lines 45A are formed. The bit lines 45A isolate the storage node contact plugs 28A and 28B from each other. The storage node contact plugs 28A and 28B are formed as the bit lines 45A isolate dual storage node contact plugs. The bit lines 45A are formed by etching an inter-layer insulation layer 25 to thereby form a damascene pattern and then filling the inside of the damascene pattern. Therefore, the bit lines 45A are referred to as damascene bit lines. The damascene pattern separates the dual storage node contact plugs into storage node contact plugs 28A and 28B. A bit line hard mask layer pattern 46A is formed over the bit lines 45A. A barrier layer pattern 44A is formed on the external walls and bottom surface of each bit line 45A. A first spacer 41A, an air gap 47, and a second spacer 43 are formed between the bit lines 45A and the storage node contact plugs 28A and 28B. The first and second spacers 41A and 43 may be a nitride layer such as a silicon nitride ($Si_3N_4$) layer. The storage node contact plugs 28A and 28B may be a polysilicon layer. A capping layer 48 hermetically sealing the upper portion of the air gap 47 is formed. A hard mask pattern 29A is formed in the upper portion of the storage node contact plugs 28A and 28B and the inter-layer insulation layer 25.

According to the second exemplary embodiment of the present invention described above, the first spacer 41A, the air gap 47, and the second spacer 43 are between the storage node contact plugs 28A and 28B and the bit lines 45A. To be specific, an insulation structure of $Si_3N_4$-air gap-$Si_3N_4$ (which is referred to as N-air gap-N, hereafter) where the air gap 47 is disposed between the first spacer 41A and the second spacer 43 is formed.

The parasitic capacitance between the storage node contact plugs 28A and 28B and the bit lines 45A may be decreased by forming the air gap 47 between the storage node contact plugs 28A and 28B and the bit lines 45A.

FIGS. 4A to 4I are cross-sectional views illustrating a method for fabricating a semiconductor device in accordance with a second exemplary embodiment of the present invention. In this second exemplary embodiment the method for forming the damascene pattern 30 is the same as described above with reference to FIGS. 2A to 2C. Accordingly, a description of the method for the damascene pattern 30 in the second exemplary embodiment is omitted, and FIG. 4A begins with the structure shown in FIG. 2C.

Figure 4A:
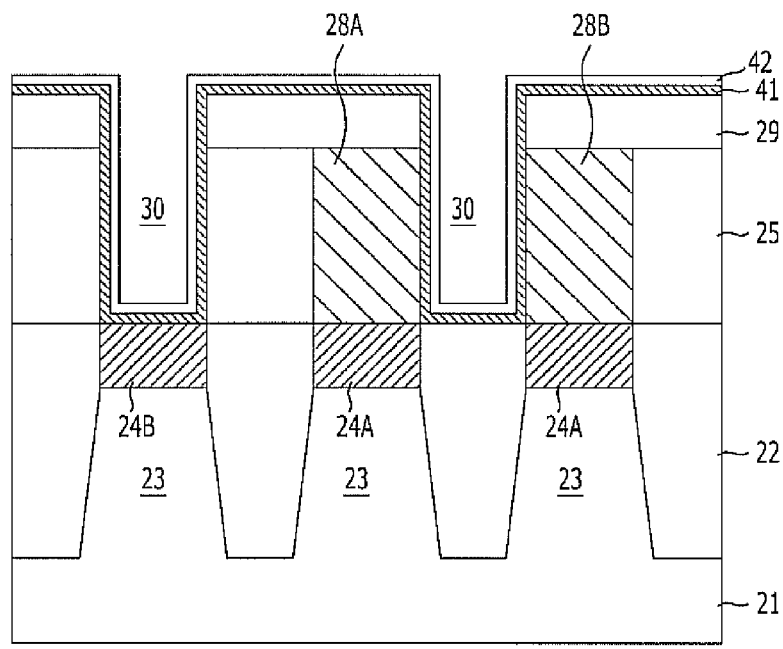
FIGS. 4A to 4I are cross-sectional views illustrating a method for fabricating a semiconductor device in accordance with the second exemplary embodiment of the present invention.

Referring to FIG. 4A, a first spacer layer 41 and a second spacer layer 42 are stacked over a substrate structure including the damascene pattern 30. The first spacer layer 41 may be a silicon nitride layer. The second spacer layer 42 may be a titanium nitride (TN) layer.

Figure 4B:
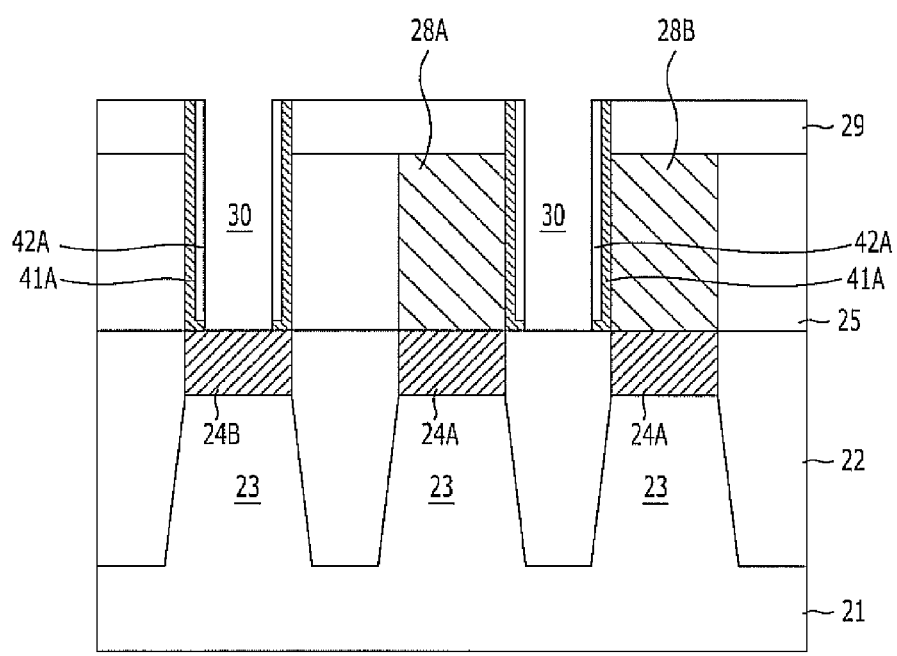

Referring to FIG. 4B, the first spacer layer 41 and the second spacer layer 42 are etched selectively. The first spacer layer 41 and the second spacer layer 42 are etched through an etch-back process. As a result, the first spacer 41A and a sacrificial spacer 42A are formed on the sidewalls of the damascene pattern 30. The first spacer 41A is formed by performing an etch-back process onto the first spacer layer 41, and the sacrificial spacer 42A is formed by performing an etch-back process onto the second spacer layer 42. When the etch-back process is performed, the second spacer layer 42 is etched back first, and then the first spacer layer 41 is etched back.

Figure 4C:
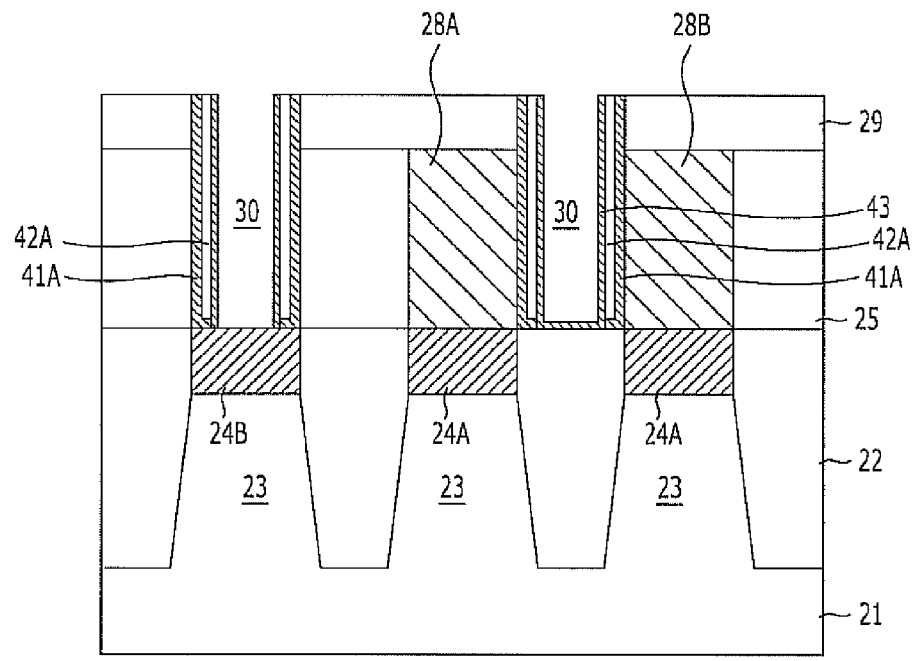

Referring to FIG. 4C, a second spacer 43 is formed on the sidewalls of the sacrificial spacer 42A. The second spacer 43 may be a nitride layer such as a silicon nitride layer. For example, the second spacer 43 may be formed by depositing a nitride layer over the substrate structure, including the damascene pattern 30 with the sacrificial spacer 42A, and then performing an etch-back process to remove select portions of the nitride layer.

The second spacer 43 formed on the sidewalls of the storage node contact plugs 28A and 28B may remain on the bottom surface. This prevents a short from occurring between damascene bit lines 45A and the first landing plugs 24A. An additional mask is used to make the spacer 32 remain on the bottom surface between the storage node contact plugs 28A and 28B. The additional mask is a bit line contact mask that is patterned to selectively expose the second landing plug 24B. The second spacer 43 provides a bit line contact which exposes the surface of the second landing plug 24B. The first and second spacers 41A and 43 together form a bit line spacer.

As described above, the second spacer 43 covers the sidewalls of the sacrificial spacer 42A, and a triple spacer which is formed of the first spacer 41A, the sacrificial spacer 42A, and the second spacer 43 is formed on the sidewalls of the damascene pattern 30. When the sacrificial spacer 42A is a titanium nitride layer, and the first and second spacers 41A and 43 are silicon nitride layers, the triple spacer has a structure of $Si_3N_4$—TiN—$Si_3N_4$ (which is referred to as an 'N—TiN—N' structure hereafter). When the sacrificial spacer 42A is a titanium nitride layer and the first spacer 41A is an oxide layer and the second spacer 43 is a nitride layer, the triple spacer has a structure of O—TiN—N.

Figure 4D:
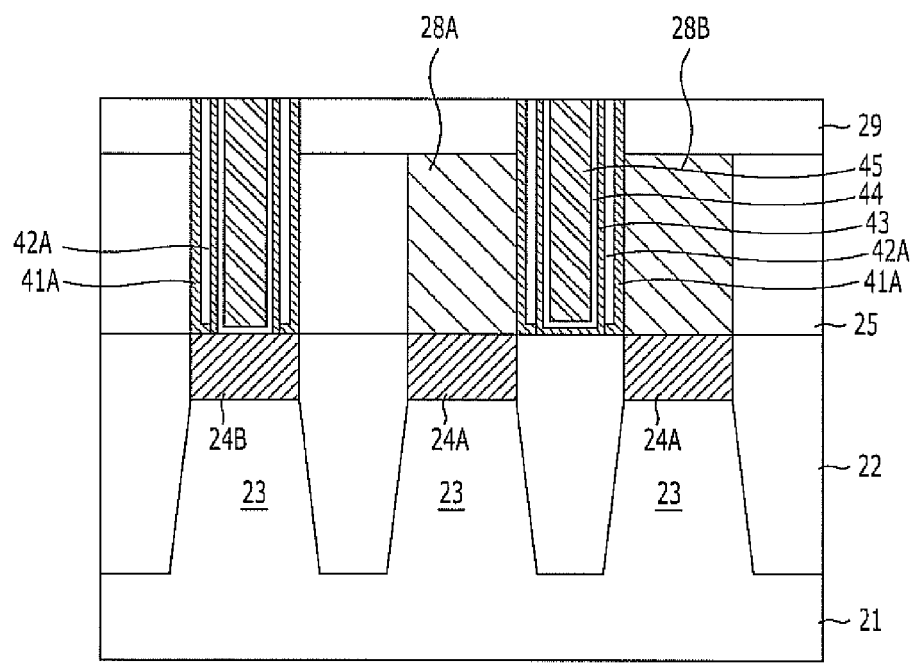

Referring to FIG. 4D, a conductive layer is formed over the substrate structure to fill the damascene pattern 30, including the first spacer 41A, the sacrificial spacer 42A, and the second spacer 43. Subsequently, an isolation process, such as a CMP process, is performed. As a result of the isolation process, the conductive layer is isolated and portions of the conductive layer remain in the damascene pattern 30. Here, the conductive layer includes a barrier layer 44 and a bit line conductive layer 45. The bit line conductive layer 45 may be formed of metal such as tungsten. The barrier layer 44 may be a titanium nitride (TIN) layer.

As described above, when the conductive layer including the barrier layer 44 and the bit line conductive layer 45 is formed, the first spacer 41A, the sacrificial spacer 42A, and the second spacer 43 remain between the storage node contact plugs 28A and 28B. In particular, the sacrificial spacer 42A remains between the first spacer 41A and the second spacer 43.

Figure 4E:
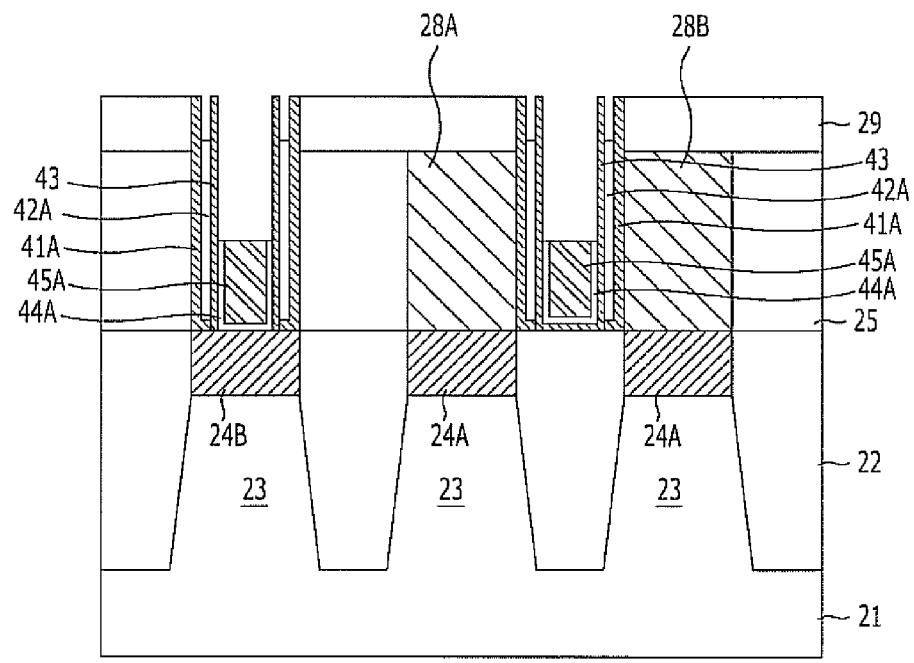

Referring to FIG. 4E, the bit line conductive layer 45 is recessed to a certain depth. As a result, the bit lines 45A, partially filling the inside of the damascene pattern 30, are formed. The bit lines 45A are damascene bit lines. When the bit line conductive layer 45 is recessed, the barrier layer 44 may be recessed at the same time. As a result, the barrier layer pattern 44A remains on the external walls and bottom surface of the bit lines 45A.

When the bit line conductive layer 45 is recessed, an etch-back process is performed. During the etch-back process, the sacrificial spacer 42A may be recessed to a certain depth. For example, when the barrier layer 44 and the sacrificial spacer 42A are formed of the same material, the upper portion of the sacrificial spacer 42A is removed forming another opening that extends to a certain depth between the first spacer 41A and the second spacer 43.

Figure 4F:
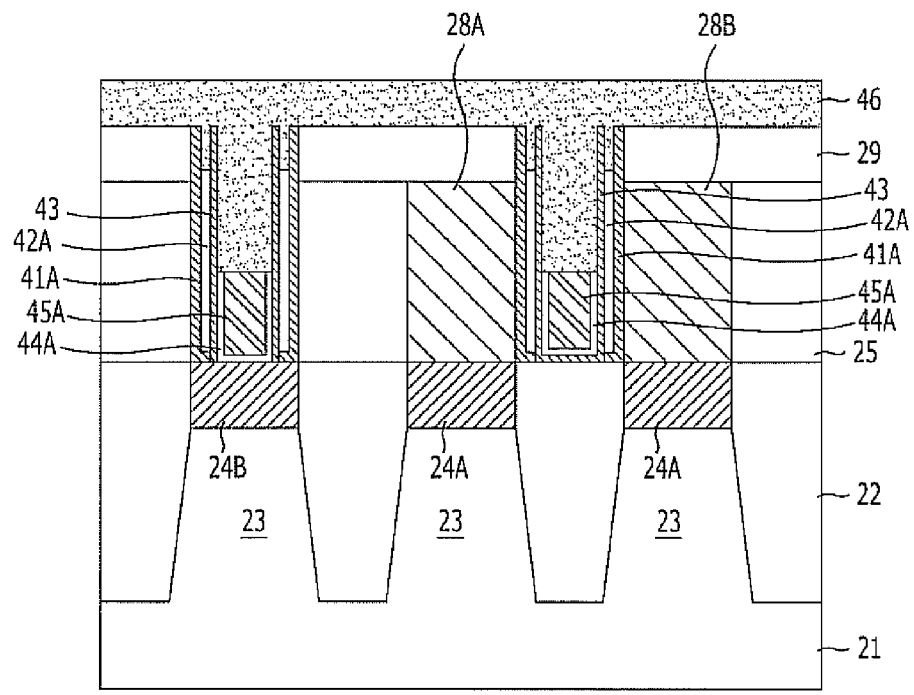

Referring to FIG. 4F, a bit line hard mask layer 46 is formed over the substrate structure including the bit lines 45A. The bit line hard mask layer 46 may be a nitride layer such as a silicon nitride layer. The bit line hard mask layer 46 gap-fills the upper portions of the bit lines 45A, and also, gap-fills the upper portions of the sacrificial spacers 42A.

Figure 4G:
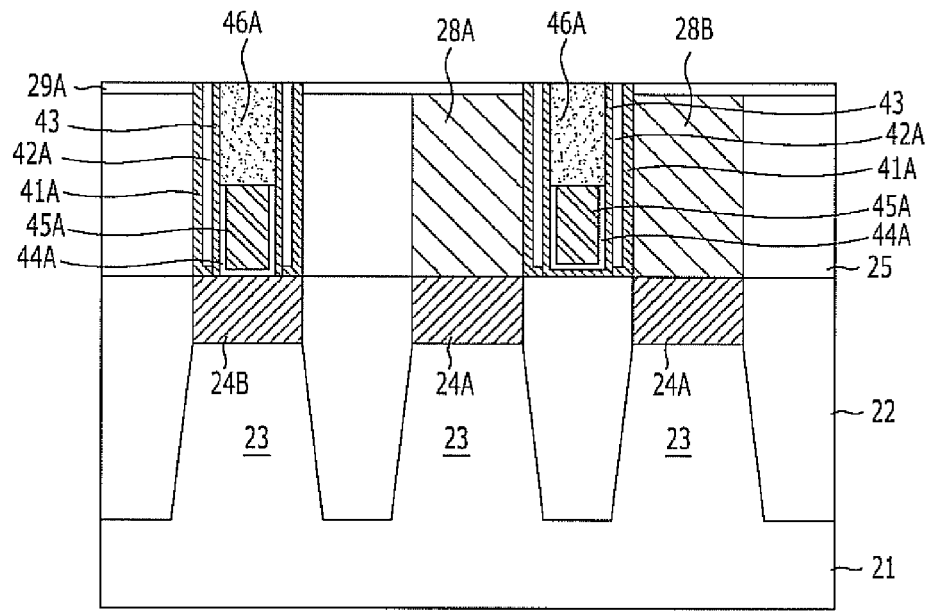

Referring to FIG. 4G, the bit line hard mask layer 46 is planarized. Herein, the planarization of the bit line hard mask layer 46 is performed targeting the upper portion of the sacrificial spacer 42A so that the upper portion of the sacrificial spacer 42A is exposed. The planarization may be performed using a CMP process. After the planarization, the bit line hard mask layer pattern 46A remains on the upper portions of the bit lines 45A. Also, a portion of the hard mask pattern 29 is planarized and the planarized hard mask pattern 29 is denoted with reference numeral '29A'.

Figure 4H:
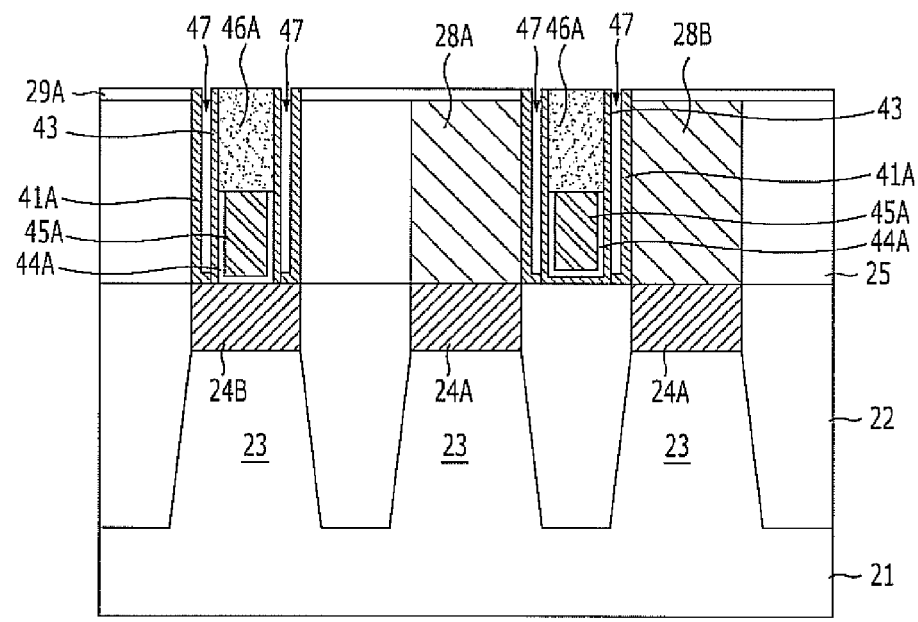

Referring to FIG. 4H, the sacrificial spacer 42A is selectively removed. As a result, the air gap 47 is formed between the storage node contact plugs 28A and 28B and the bit lines 45A. The sacrificial spacer 42A may be removed through a wet etch process or a dry etch process. When the sacrificial spacer 42A is removed, the first and second spacers 41A and 43, the storage node contact plugs 28A and 28B, the bit lines 45A, the bit line hard mask layer pattern 46A, and the inter-layer insulation layer 25 are not damaged due to etch selectivity.

When the sacrificial spacer 42A is removed, an 'N-air gap-N' structure is formed between the storage node contact plugs 28A and 28B and the bit lines 45A.

Figure 4I:
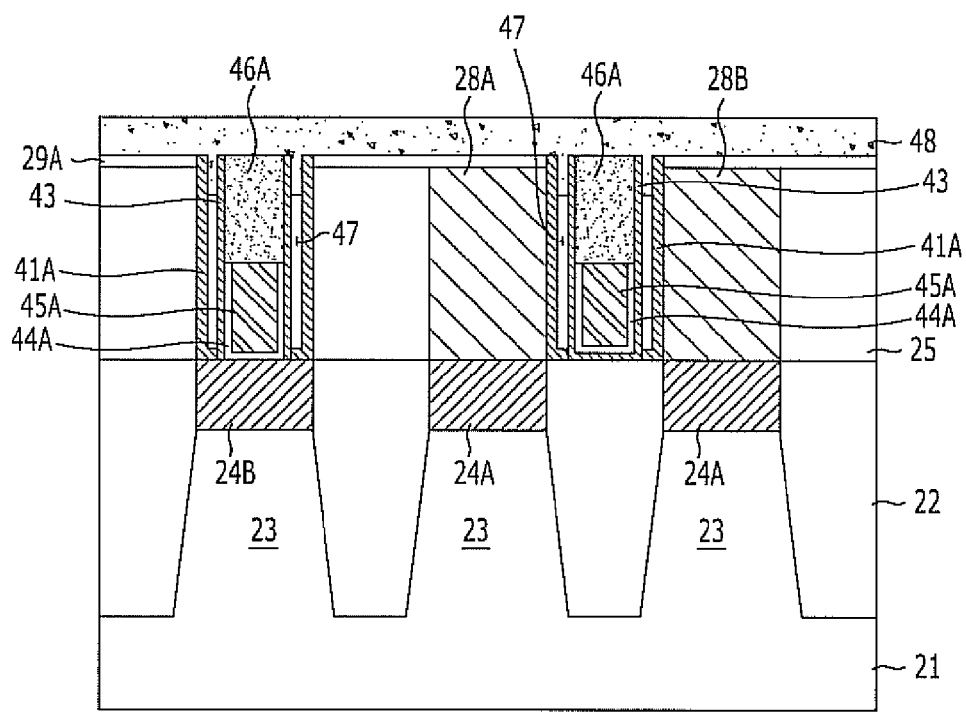

Referring to FIG. 4I, the capping layer 48 is formed over the substrate structure. The capping layer 48 prevents the lifting of the bit lines 45A due to the air gap 47. The capping layer 48 may be a nitride layer such as a silicon nitride layer. The capping layer 48 hermetically seals the upper portion of the air gap 47.

According to the second exemplary embodiment of the present invention, the air gap 47 and the first and second spacers 41A and 43 are between the storage node contact plugs 28A and 28B and the bit lines 45A. Since the air gap 47 is formed between the storage node contact plugs 28A and 28B and the bit lines 45A, the parasitic capacitance between the storage node contact plugs 28A and 28B and the bit lines 45A is decreased.

Figure 5A:
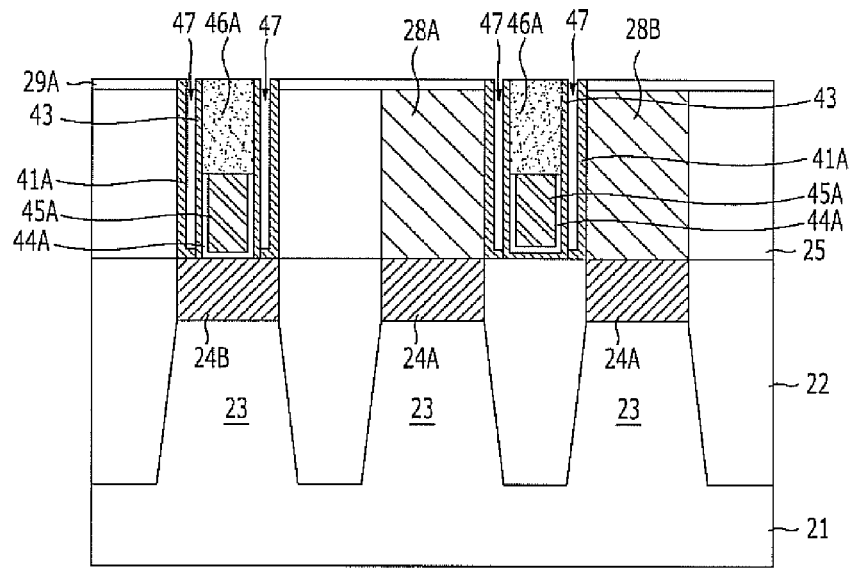
FIGS. 5A to 5C are cross-sectional views illustrating a method for fabricating a semiconductor device in accordance with a third exemplary embodiment of the present invention.
Figure 5B:
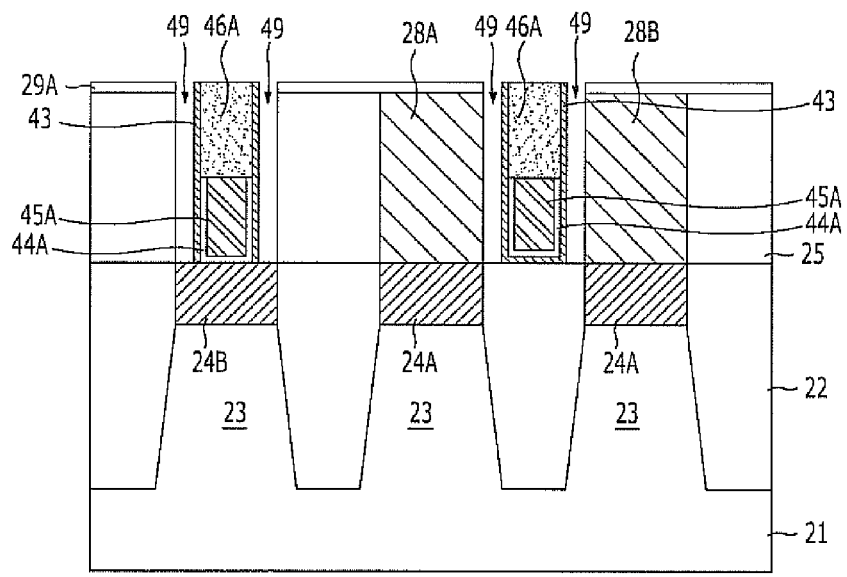
Figure 5C:
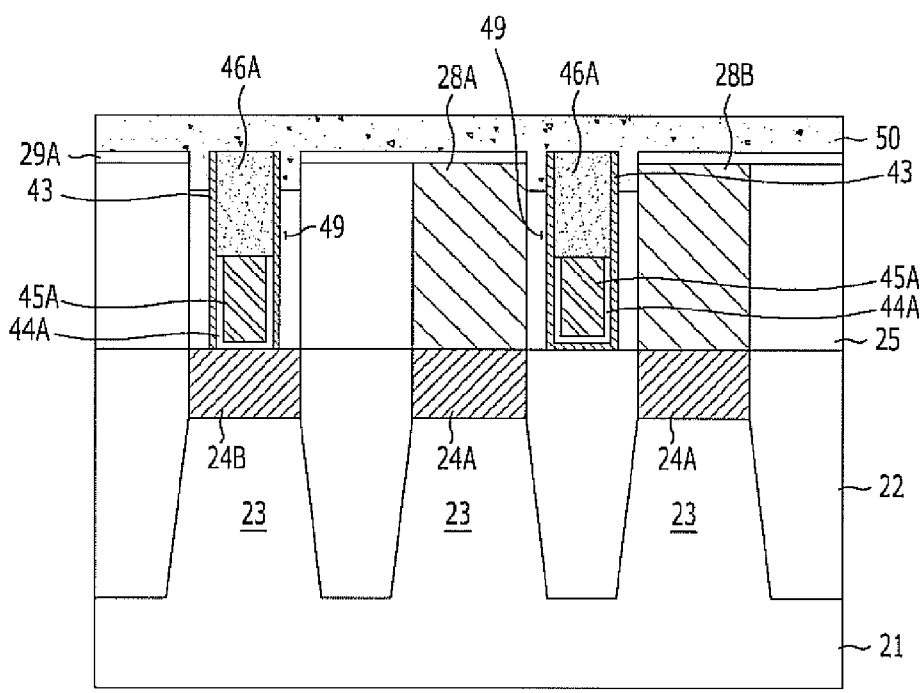

FIGS. 5A to 5C are cross-sectional views illustrating a method for fabricating a semiconductor device in accordance with a third exemplary embodiment of the present invention. The third exemplary embodiment is similar to the second exemplary embodiment, except that the first spacer is an oxide layer. More specifically, steps shown in FIGS. 4A to 4H are included in the method of fabricating the semiconductor device in accordance with the third exemplary embodiment. Accordingly, a description of the steps shown in FIGS. 4A to 4H is omitted below, and FIG. 5A illustrates the same structure shown in FIG. 4H.

Referring to FIG. 5A, the air gap 47 is formed according to the method illustrated in FIGS. 4A to 4H.

Referring to FIG. 5B, the first spacer 41A is selectively removed. As a result, the air gap 47 is widened to obtain the air gap 49.

The air gap 49 is formed between the second spacer 43 and the storage node contact plugs 28A and 28B. Together the second spacer 43 and the air gap 49 form an insulation structure between the storage node contact plugs 28A and 28B and the bit lines 45A. Therefore, when the second spacer 43 is a nitride layer, the insulation structure may be referred to as an 'air gap-N' structure.

Referring to FIG. 5C, the capping layer 50 is formed over the substrate structure. The capping layer 50 prevents the lifting of the bit lines 45A due to the air gap 49. The capping layer 50 hermetically seals the upper portion of the air gap 49.

According to the third exemplary embodiment of the present invention, the air gap 49 and the second spacer 43 are between the storage node contact plugs 28A and 28B and the bit lines 45A. The parasitic capacitance between the storage node contact plugs 28A and 28B and the bit lines 45A is decreased by forming the air gap 49 between the storage node contact plugs 28A and 28B and the bit lines 45A.

FIGS. 6A to 6K are cross-sectional views illustrating a method for fabricating a semiconductor device in accordance with a fourth exemplary embodiment of the present invention.

Figure 6A:
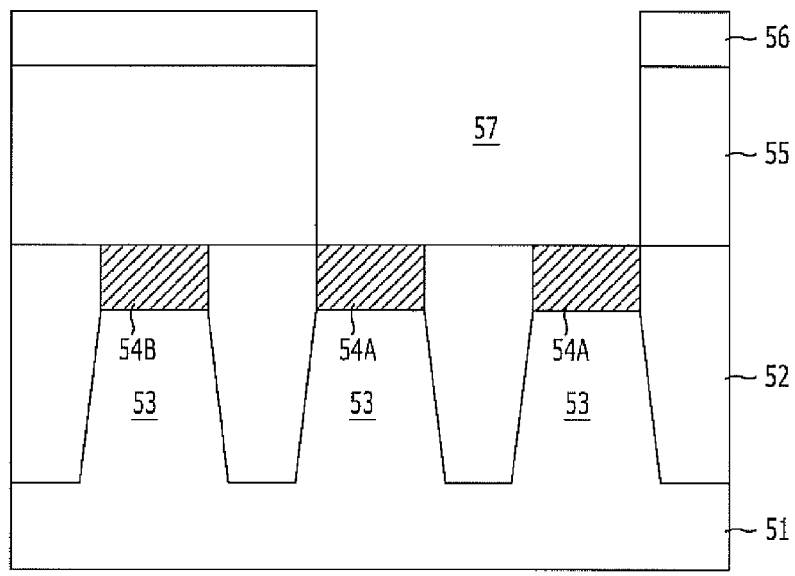
FIGS. 6A to 6K are cross-sectional views illustrating a method for fabricating a semiconductor device in accordance with a fourth exemplary embodiment of the present invention.

Referring to FIG. 6A, the isolation layer 52 is formed over the semiconductor substrate 51. The isolation layer 52 is formed through a well-known Shallow Trench Isolation (STI) process. The isolation layer 52 defines the active regions 53. Although not illustrated in FIG. 6A, a process for forming buried gates (BG) may be performed after the isolation layer 52 is formed. The buried gates may be formed through a conventional method for forming buried gates.

Subsequently, first landing plugs 54A to be coupled with storage node contact plugs and a second landing plug 54B to be coupled with a bit line are formed on the surface of the active regions 53. The first landing plugs 54A and the second landing plug 54B may be formed to be self-aligned to the isolation layer 52. The first landing plugs 54A and the second landing plug 54B may be formed of a polysilicon layer.

According to another exemplary embodiment, the first landing plugs 54A and the second landing plug 54B may be formed prior to the isolation layer 52. For example, the first landing plugs 54A and the second landing plug 54B may be formed by forming a conductive layer to be used as the first landing plugs 54A and the second landing plug 54B, and then etching the conductive layer through an STI process. Subsequently, trenches are formed by using the first landing plugs 54A and the second landing plug 54B as etch barriers and etching the semiconductor substrate 51. Then, the isolation layer 52 can be formed by filling the trenches.

Returning to the exemplary embodiment of FIG. 6A, after forming the first landing plugs 54A and the second landing plug 54B, the inter-layer insulation layer 55 is formed over the resultant substrate structure. The inter-layer insulation layer 55 may be an oxide layer, such as BPSG (Boron Phosphorus Silicate Glass).

Next, the inter-layer insulation layer 55 is etched by using a storage node contact mask 56 as an etch barrier. As a result, dual storage node contact holes 57 are formed. Each of the dual storage node contact holes 57 simultaneously opens the first landing plugs 54A on the upper portions of neighboring active regions 53.

Figure 6B:
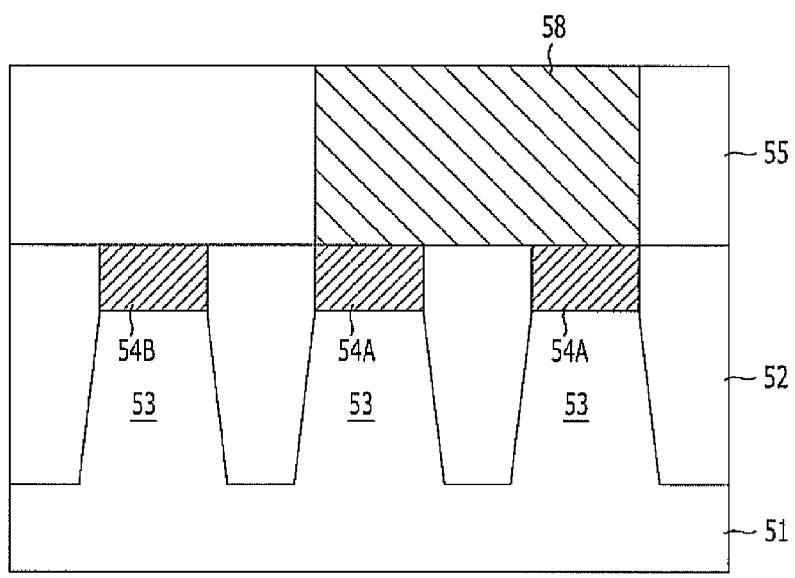

Referring to FIG. 6B, the storage node contact mask 56 is removed, and then a dual storage node contact plug 58 filling the dual storage node contact holes 57 is formed. The dual storage node contact plug 58 is formed by depositing a tungsten layer and performing a Chemical Mechanical Polishing (CMP) or an etch-back process.

Figure 6C:
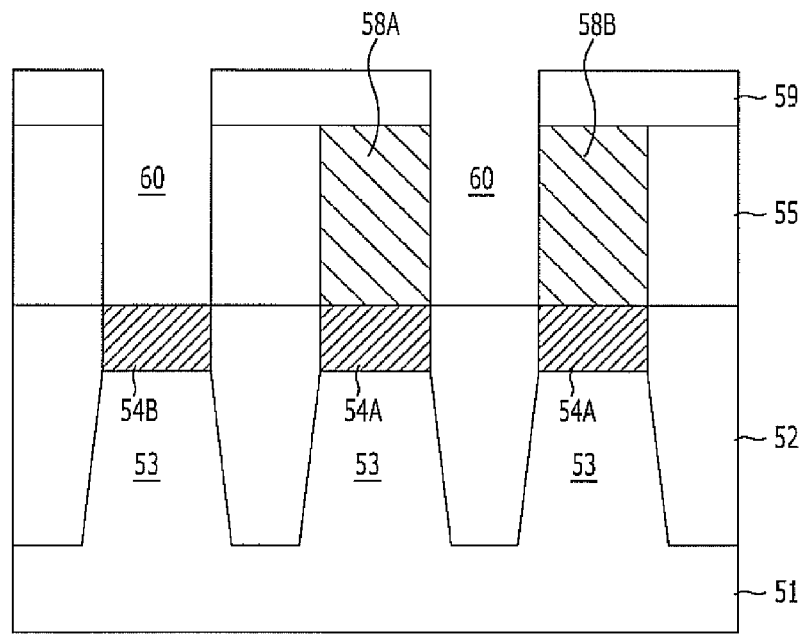

Referring to FIG. 6C, a damascene mask 59 is formed. The damascene mask 59 is a mask designed to separate the dual storage node contact plug 58 and to form a damascene pattern where bit lines are subsequently formed. The damascene mask 59 may be a photoresist pattern or a hard mask pattern. Hereafter, the damascene mask 59 is referred to as a hard mask pattern 59. The hard mask pattern 59 may be a nitride layer, such as a silicon nitride layer.

The dual storage node contact plug 58 and the inter-layer insulation layer 55 are etched by using the hard mask pattern 59 as an etch barrier. As a result, a damascene pattern 60 is formed, and the storage node contact plugs 58A and 58B that are independent from each other due to the damascene pattern 60 are formed. Also, the damascene pattern 60 exposes the second landing plug 54B and the isolation layer 52. The damascene pattern 60 may be formed by etching the dual storage node contact plug 58 first and then etching the inter-layer insulation layer 55. Alternatively, it is possible to form the damascene pattern 60 by etching the inter-layer insulation layer 55 first and then etching the dual storage node contact plug 58 or by simultaneously etching the inter-layer insulation layer 55 and the dual storage node contact plug 58.

Figure 6D:
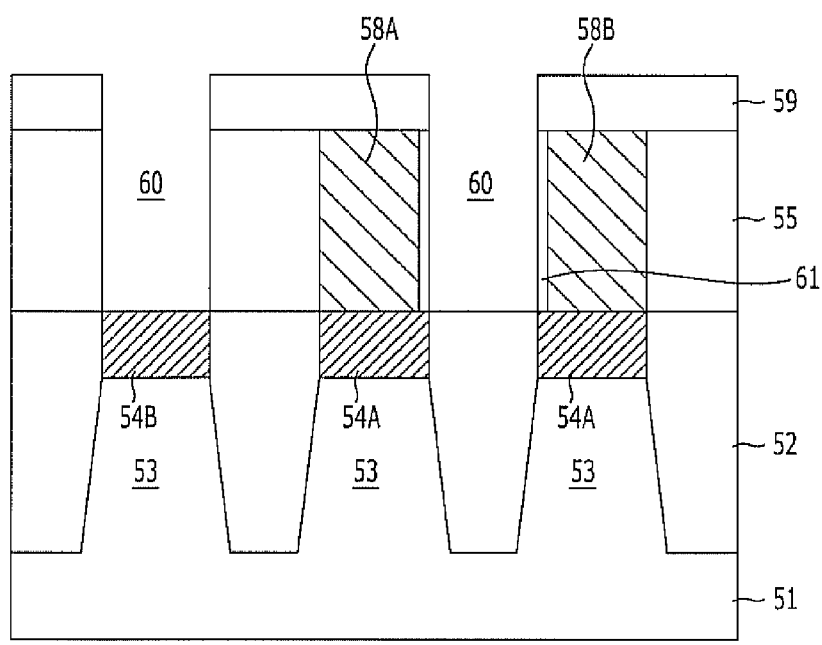

Referring to FIG. 6D, the sidewalls of the storage node contact plugs 58A and 58B exposed by the damascene pattern 60 are oxidized. As a result, a first spacer 61 is formed on the sidewalls of the storage node contact plugs 58A and 58B. Since the storage node contact plugs 58A and 58B are tungsten layers, the first spacer 61 becomes a tungsten oxide layer.

Figure 6E:
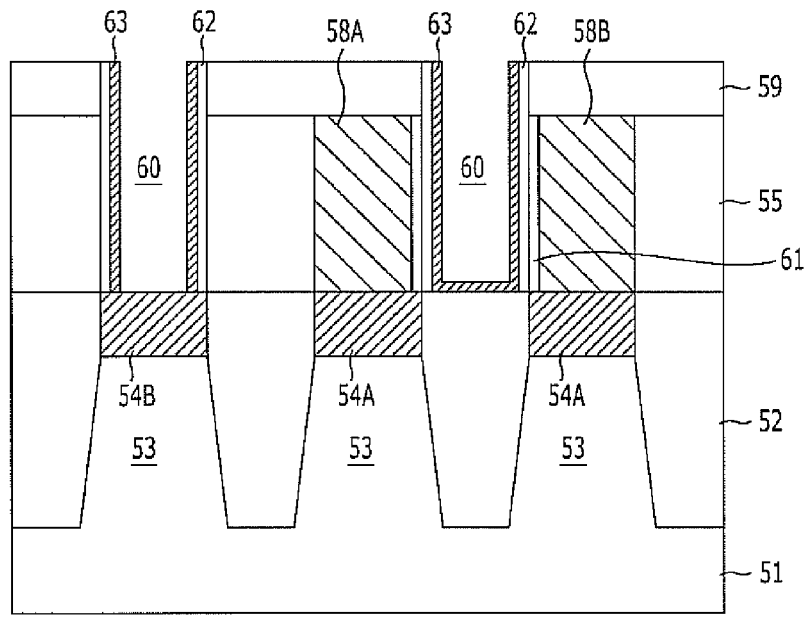

Referring to FIG. 6E, a sacrificial spacer 62 is formed on the sidewalls of the first spacer 61. The sacrificial spacer 62 may be a titanium nitride layer. The sacrificial spacer 62 may be formed by depositing a sacrificial spacer layer (e.g., a titanium nitride layer) over the substrate structure, including the damascene pattern 60 with the first spacer 61, and then performing an etch-back process to remove portions (e.g., horizontal surfaces) of the sacrificial spacer layer.

A second spacer 63 is formed on the sidewalls of the sacrificial spacer 62. The second spacer 63 may include a nitride layer such as a silicon nitride layer. The second spacer 63 may be formed by depositing a second spacer layer (e.g., a nitride layer) over the substrate structure, including the damascene pattern 60 with the sacrificial spacer 62, and then performing an etch-back process to remove portions (e.g., select horizontal surfaces) of the second spacer layer.

The second spacer 63 formed on the sidewalls of the storage node contact plugs 58A and 58B may remain on the bottom surface. The remaining second spacer 63 prevents a short from occurring between damascene bit lines and the first landing plugs 54A. An additional mask is used to make the second spacer 63 remain on the bottom surface between the storage node contact plugs 58A and 58B. The additional mask is a bit line contact mask that is patterned to selectively expose the second landing plug 54B. The second spacer 63 provides a bit line contact which exposes the surface of the second landing plug 54B. Accordingly, the first and second spacers 61 and 63 become bit line spacers.

As described above, the second spacer 63 covers the sidewalls of the sacrificial spacer 62, and thus, a triple spacer, which includes the first to third spacers, is formed on the sidewalls of the damascene pattern 60. The sacrificial spacer 62 may be a titanium nitride layer, and the first spacer 61 may be a tungsten oxide layer. Where the second spacer 63 is a silicon nitride layer, the triple spacer has a structure of '$WO_3$—TiN—$Si_3N_4$'.

Figure 6F:
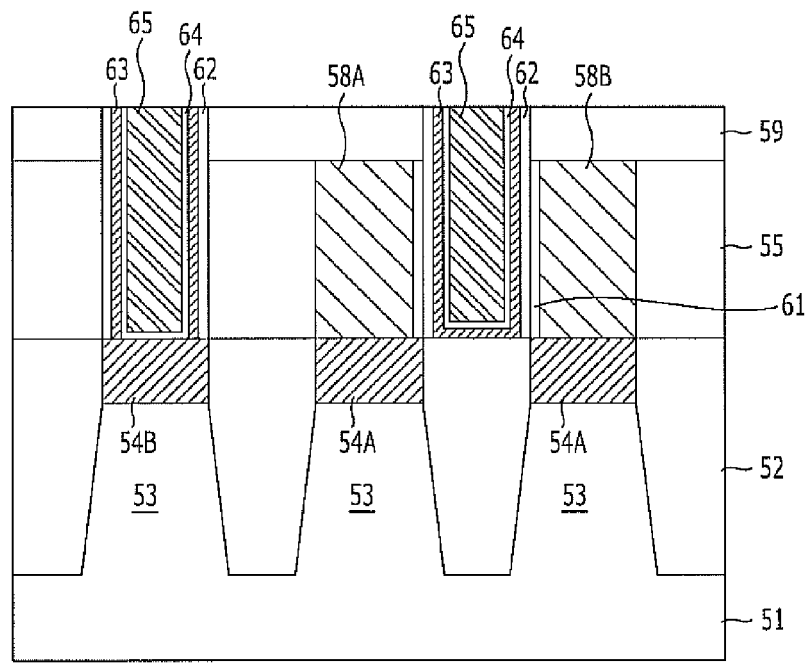

Referring to FIG. 6F, a conductive layer is formed over the substrate structure to fill the damascene pattern 30 with the first spacer 61, the sacrificial spacer 62, and the second spacer 63 formed therein. Subsequently, the conductive layer remains inside the damascene pattern 60 by performing an isolation process such as Chemical Mechanical Polishing (CMP). The conductive layer includes a barrier layer 64 and a bit line conductive layer 65. The bit line conductive layer 64 may be formed of metal such as tungsten. The barrier layer 63 may be a titanium nitride (TiN) layer.

As described above, when the conductive layer including the barrier layer 64 and the bit line conductive layer 65 is formed, the first spacer 61, the sacrificial spacer 62, and the second spacer 63 remain between the conductive layer and the storage node contact plugs 58A and 58B.

Figure 6G:
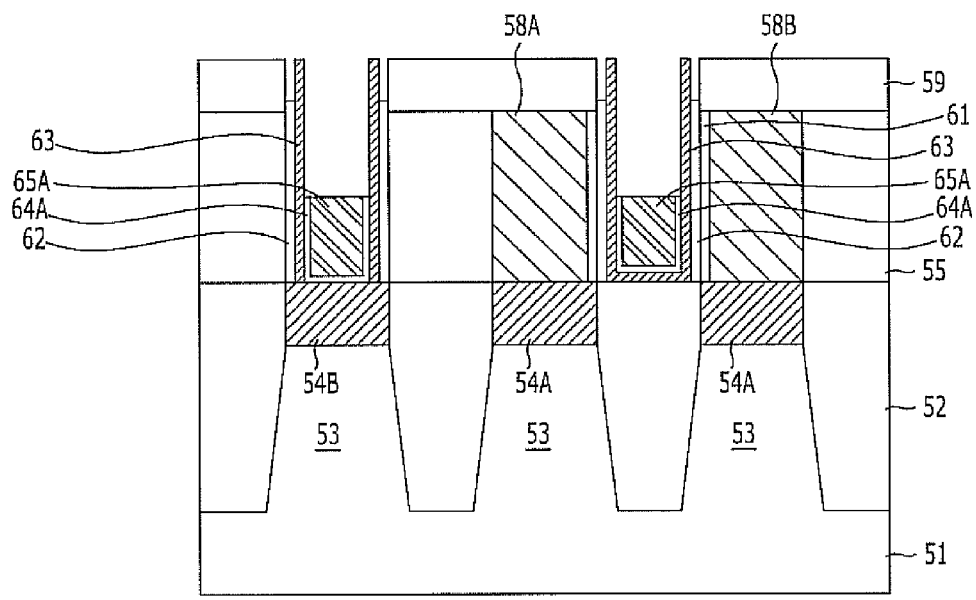

Referring to FIG. 6G, the bit line conductive layer 65 is recessed to a certain depth. As a result, the bit lines 65A partially filling the inside of the damascene pattern 60 are formed. The bit lines 65A become damascene bit lines. When the bit line conductive layer 65 is recessed, the barrier layer 64 is simultaneously recessed as well. As a result, a barrier layer pattern 64A remains on the external walls and bottom surface of the bit lines 65A.

When the bit line conductive layer 65 is recessed, an etch-back process is performed. During the etch-back process, the sacrificial spacer 62 may be recessed to a certain depth. For example, when the barrier layer 64 and the sacrificial spacer 62 are formed of the same material, the upper portion of the sacrificial spacer 62 is removed forming another opening that extends to a certain depth between the second spacer 63 and the hard mask pattern 59.

Figure 6H:
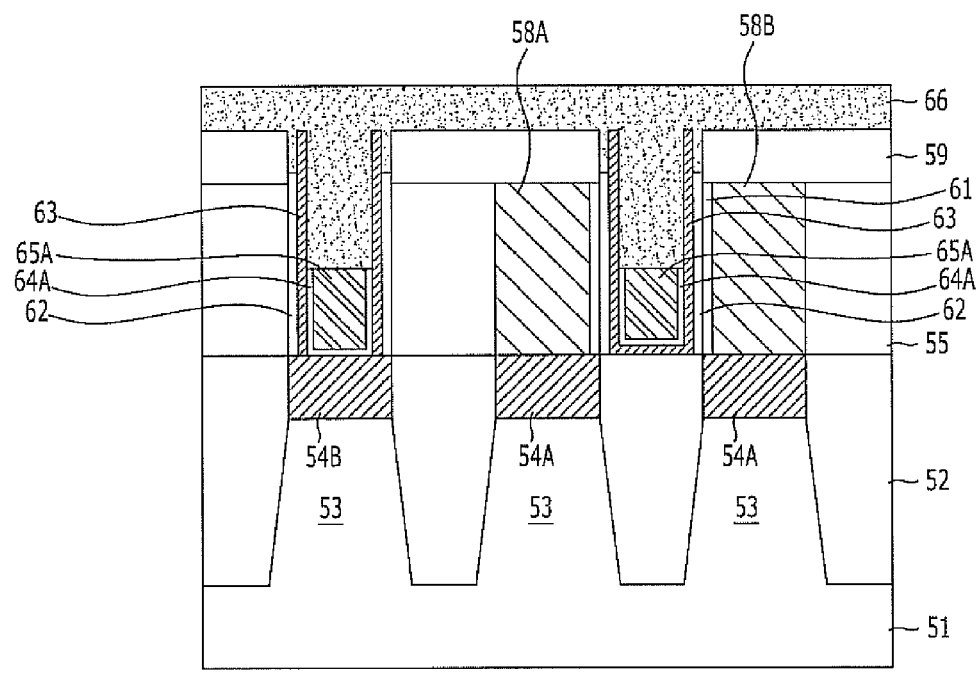

Referring to FIG. 6H, a bit line hard mask layer 66 is formed over the substrate structure including the bit lines 65A. The bit line hard mask layer 66 may be a nitride layer such as a silicon nitride layer. The bit line hard mask layer 66 gap-fills the upper portion of the bit lines 65A, and also, gap-fills the upper portion of the sacrificial spacer 62.

Figure 6I:
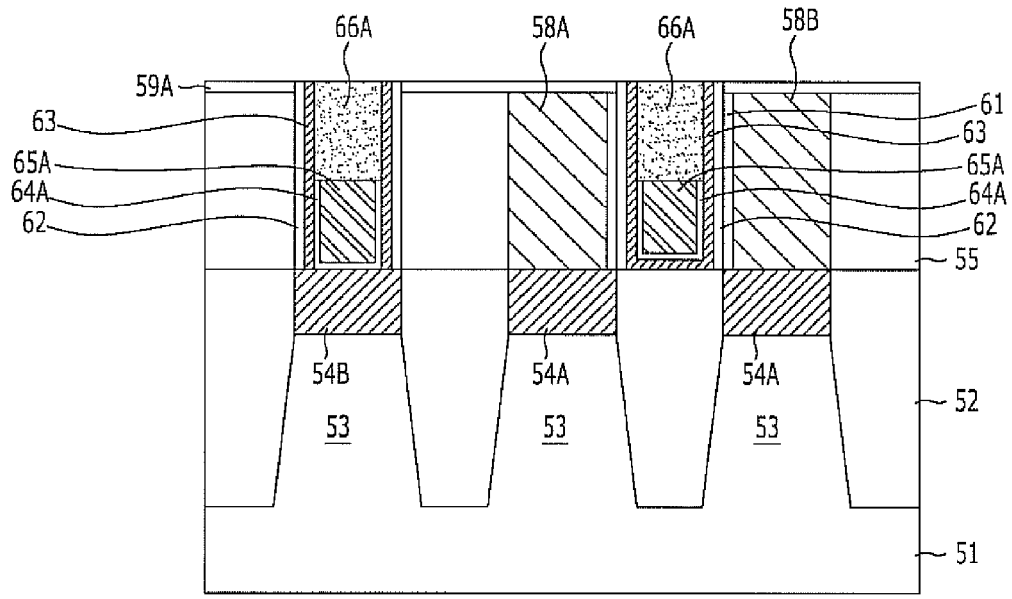

Referring to FIG. 6I, the bit line hard mask layer 66 is planarized. Herein, the planarization of the bit line hard mask layer 66 is performed targeting the upper portion of the sacrificial spacer 62 so that the upper portion of the sacrificial spacer 62 is exposed. The planarization may be performed using a CMP process. As a result of the planarization, the bit line hard mask layer pattern 66A remains on the upper portion of the bit lines 65A. Also, a portion of the hard mask pattern 59 is planarized. The remaining hard mask pattern 59 is denoted with reference numeral 59A.

Figure 6J:
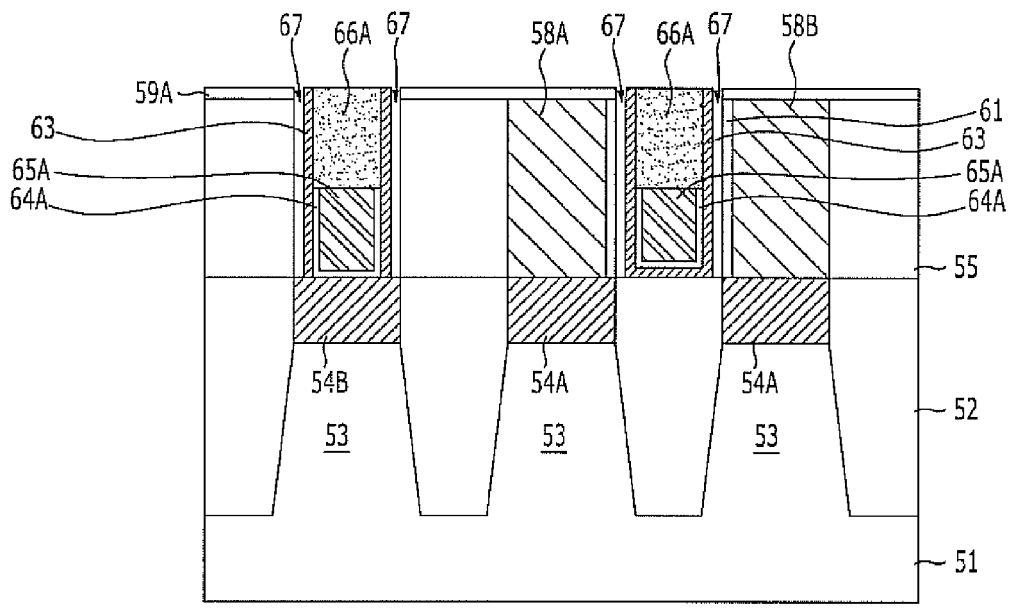

Referring to FIG. 6J, the sacrificial spacer 62 is selectively removed. As a result, the air gap 67 is formed between the storage node contact plugs 58A and 58B and the bit lines 55A. The sacrificial spacer 62 may be removed through a wet etch process or a dry etch process. When the sacrificial spacer 62 is removed, the first and second spacers 61 and 63, the storage node contact plugs 58A and 58B, the bit lines 65A, the bit line hard mask layer pattern 66A, and the inter-layer insulation layer 65 are not damaged due to etch selectivity.

When the sacrificial spacer 62 is a titanium nitride layer, a wet cleaning process using a mixed solution of sulfuric acid ($H_2SO_4$) and hydrogen peroxide ($H_2O_2$) is performed.

When the sacrificial spacer 62 is removed as described above, an insulation layer of '$WO_3$-air gap-$Si_3N_4$' may be formed between the storage node contact plugs 58A and 58B and the bit lines 65A.

Figure 6K:
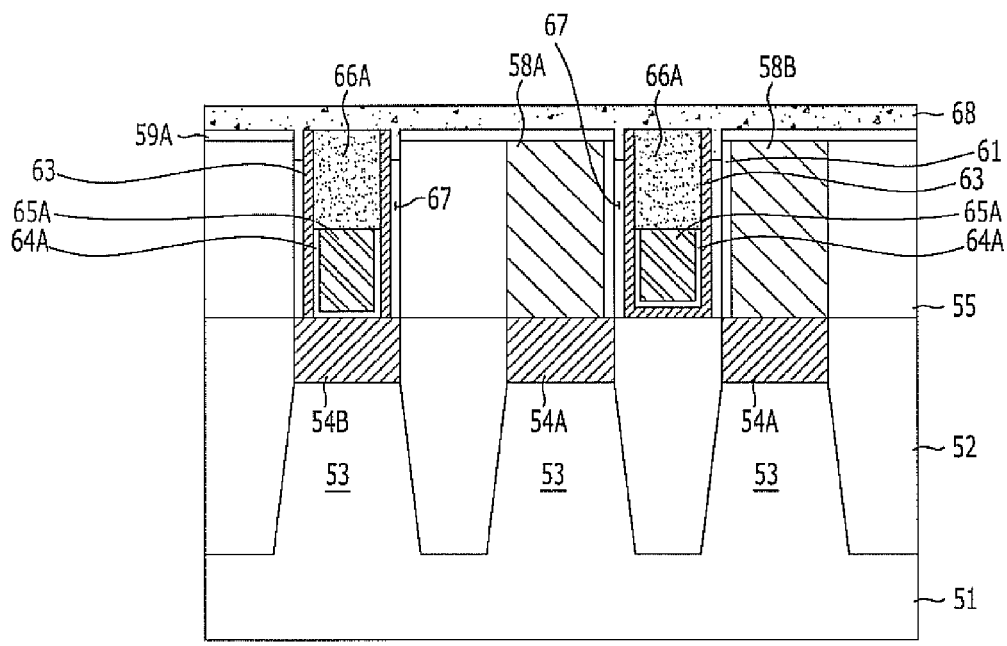

Referring to FIG. 6K, a capping layer 68 is formed over the substrate structure. The capping layer 68 prevents the lifting of the bit lines 65A due to the air gap 67. The capping layer 68 may be a nitride layer such as a silicon nitride layer. The capping layer 68 hermetically seals the upper portion of the air gap 67.

According to the fourth exemplary embodiment of the present invention, the air gap 67 and the first and second spacers 61 and 63 are between the storage node contact plugs 58A and 58B and the bit lines 65A. Since the air gap 67 is formed between the storage node contact plugs 58A and 58B and the bit lines 65A, the parasitic capacitance between the storage node contact plugs 58A and 58B and the bit lines 65A is decreased.

FIGS. 7A to 7G are cross-sectional views illustrating a method for fabricating a semiconductor device in accordance with a fifth exemplary embodiment of the present invention.

In the fifth embodiment, the process before the first spacer is formed is the same as the fourth exemplary embodiment. Hereafter, method of fabricating the fifth exemplary embodiment is described beginning from the formation of the first spacer 61. That is, FIG. 7A shows the resultant structure of FIGS. 6A to 6D.

Figure 7A:
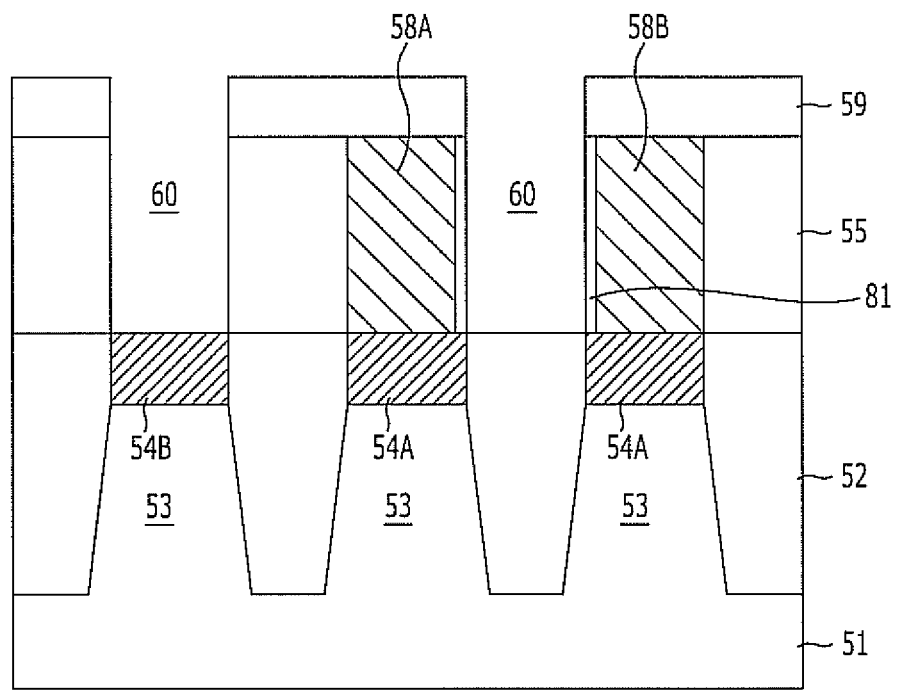
FIGS. 7A to 7G are cross-sectional views illustrating a method for fabricating a semiconductor device in accordance with a fifth exemplary embodiment of the present invention.

Referring to FIG. 7A, the sidewalls of the storage node contact plugs 58A and 58B exposed by the damascene pattern 60 are oxidized. As a result, a sacrificial spacer 81 is formed on the sidewalls of the storage node contact plugs 58A and 58B. When the storage node contact plugs 58A and 58B are tungsten layers, the sacrificial spacer 81 becomes a tungsten oxide layer.

Figure 7B:
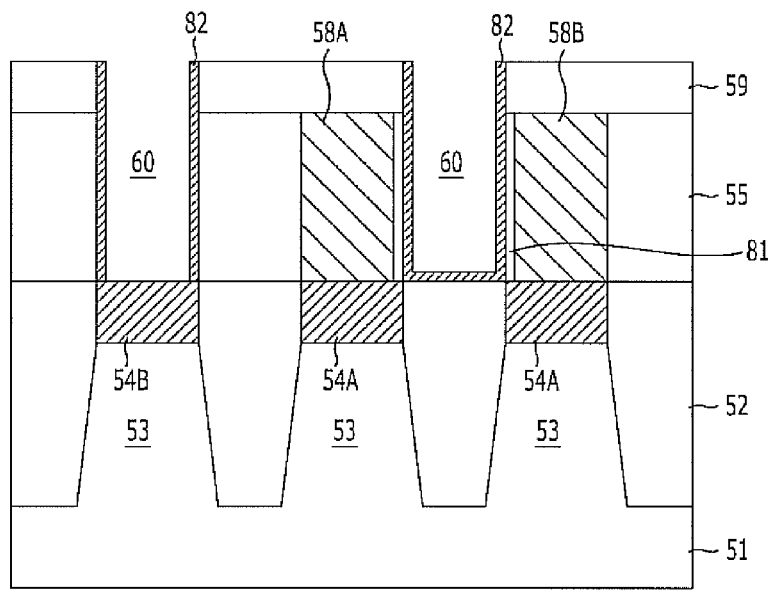

Referring to FIG. 7B, a spacer 82 is formed on the sidewalls of the sacrificial spacer 81. The spacer 82 may be a nitride layer such as a silicon nitride layer. The spacer 82 may be formed by depositing a spacer layer (e.g., a nitride layer) over the substrate structure, including the damascene pattern 60 with the sacrificial spacer 81, and then performing an etch-back process to remove select portions of the spacer layer.

The spacer 82 formed on the sidewalls of the storage node contact plugs 58A and 58B may remain on the bottom surface. The remaining spacer 82 prevents a short from occurring between damascene bit lines and the first landing plugs 54A. An additional mask is used to make the spacer 82 remain on the bottom surface between the storage node contact plugs 58A and 58B. The additional mask is a bit line contact mask that is patterned to selectively expose the second landing plug 54B. The spacer 82 provides a bit line contact which exposes the surface of the second landing plug 54B. The spacer 82 becomes a bit line spacer.

As described above, a double spacer which is formed of the sacrificial spacer 81 and the spacer 82 is formed on the sidewalls of the damascene pattern 60. When the sacrificial spacer 81 is a tungsten oxide layer and the spacer 82 is a silicon nitride layer, the double spacer has a structure of '$WO_3$—$Si_3N_4$'.

Figure 7C:
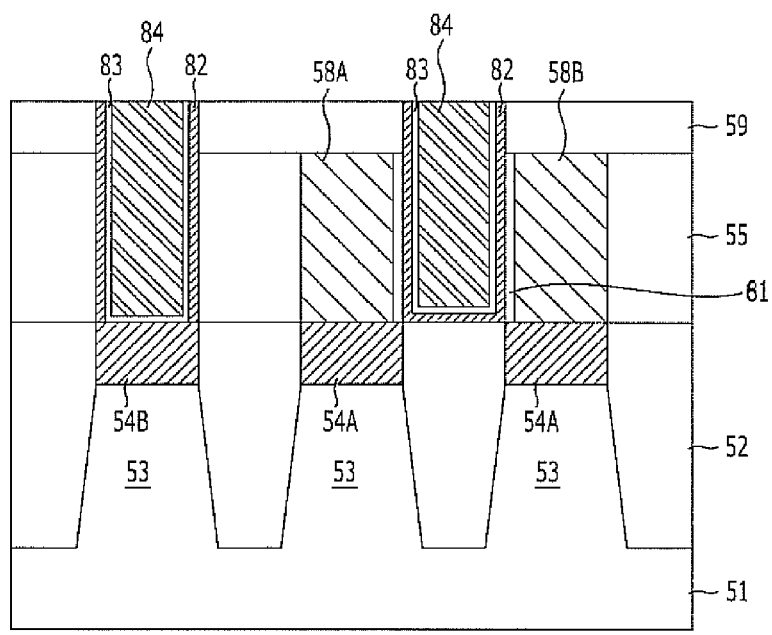

Referring to FIG. 7C, a conductive layer is formed over the substrate structure to fill the damascene pattern 60, including the sacrificial spacer 81 and the spacer 82 formed therein. Subsequently, an isolation process, such as Chemical Mechanical Polishing (CMP) process, is performed. As a result of the isolation process, the conductive layer is isolated and portions of the conductive layer remain in the damascene pattern 60. Here, the conductive layer includes a barrier layer 83 and a bit line conductive layer 84. The bit line conductive layer 84 may be formed of metal such as tungsten. The barrier layer 83 may be a titanium nitride (TiN) layer.

As described above, when the conductive layer including the barrier layer 83 and the bit line conductive layer 84 is formed, the sacrificial spacer 81 and the spacer 82 remain between the conductive layer and the storage node contact plugs 58A and 58B.

Figure 7D:
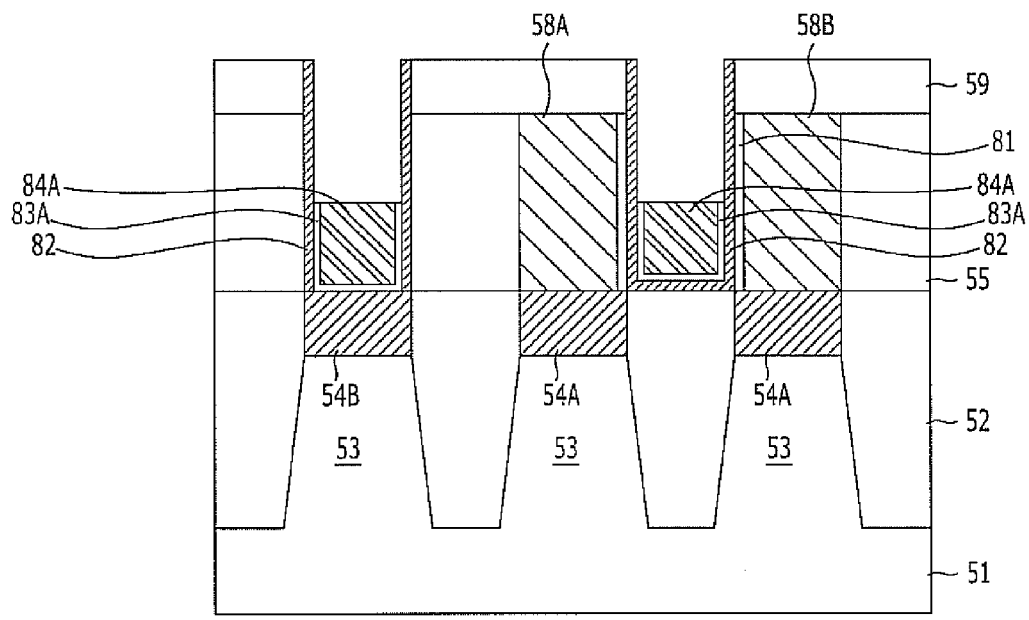

Referring to FIG. 7D, the bit line conductive layer 84 is recessed to a certain depth. As a result, the bit lines 84A, partially filling the inside of the damascene pattern 60, are formed. The bit lines 84A become damascene bit lines. When the bit line conductive layer 84 is recessed, the barrier layer 83 may be simultaneously recessed as well. As a result, a barrier layer pattern 83A remains on the external walls and bottom surface of the bit lines 84A.

Figure 7E:
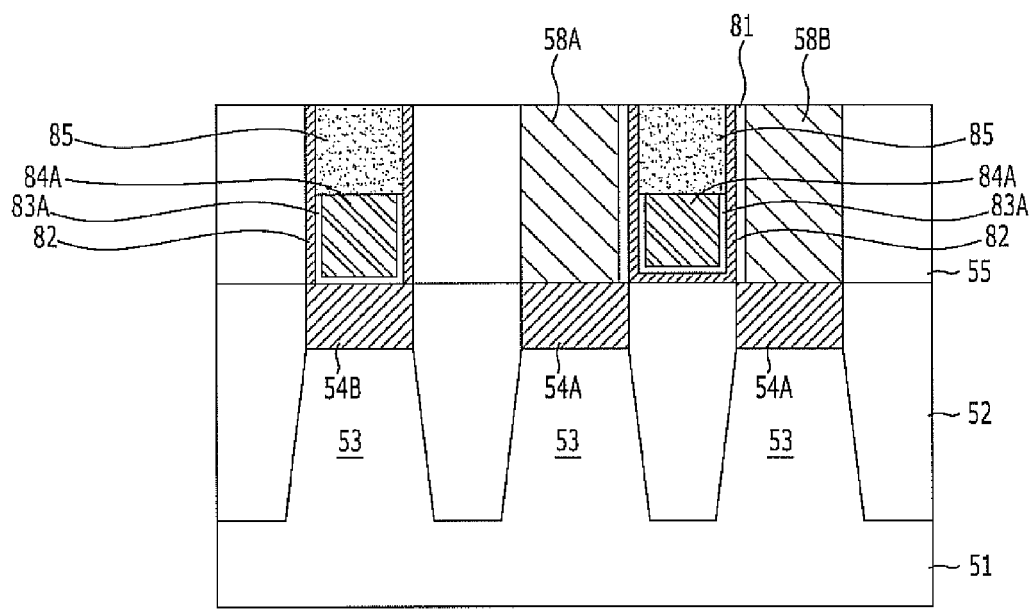

Referring to FIG. 7E, a bit line hard mask layer 85 is formed over the substrate structure including the bit lines 84A. The bit line hard mask layer 85 may be a nitride layer such as a silicon nitride layer. The bit line hard mask layer 85 gap-fills the upper portion of the bit lines 84A.

Subsequently, the bit line hard mask layer 85 is planarized. Herein, the planarization of the bit line hard mask layer 85 is performed targeting a hard mask pattern 59 so that the hard mask pattern 59 is removed. The planarization may be performed using a CMP process. As a result of the planarization, the bit line hard mask layer 85 remains on the upper portion of the bit lines 84A. Since the hard mask pattern 59 is removed, the upper portion of the sacrificial spacer 81 is exposed.

Figure 7F:
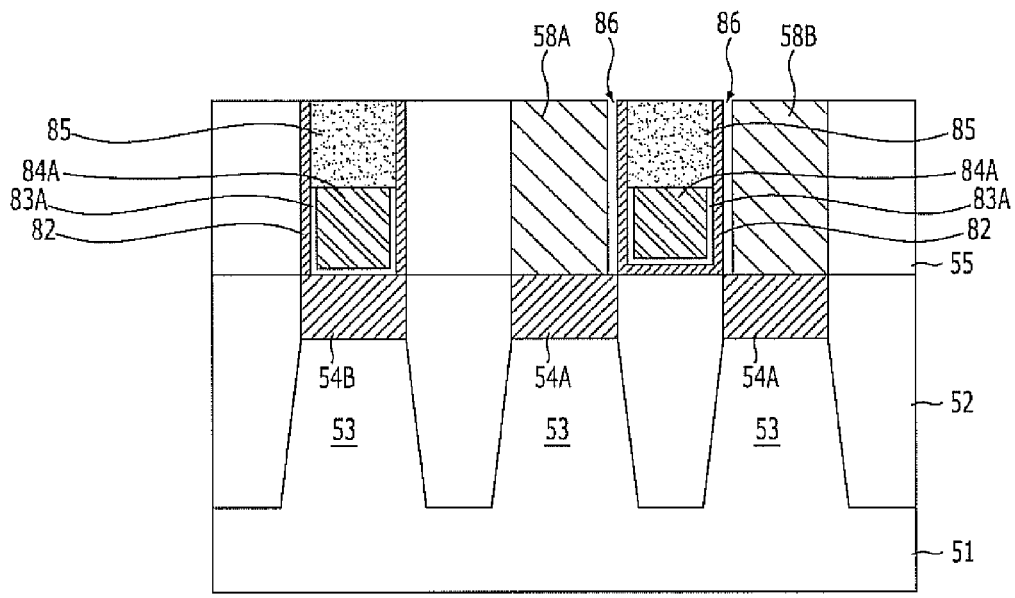

Referring to FIG. 7F, the sacrificial spacer 81 is selectively removed. As a result, the air gap 86 is formed between the storage node contact plugs 58A and 58B and the bit lines 84A. The sacrificial spacer 81 may be removed through a wet etch process or a dry etch process.

When the sacrificial spacer 81 is removed as described above, an insulation layer with an 'air gap-$Si_3N_4$' structure may be formed between the storage node contact plugs 58A and 58B and the bit lines 84A.

Figure 7G:
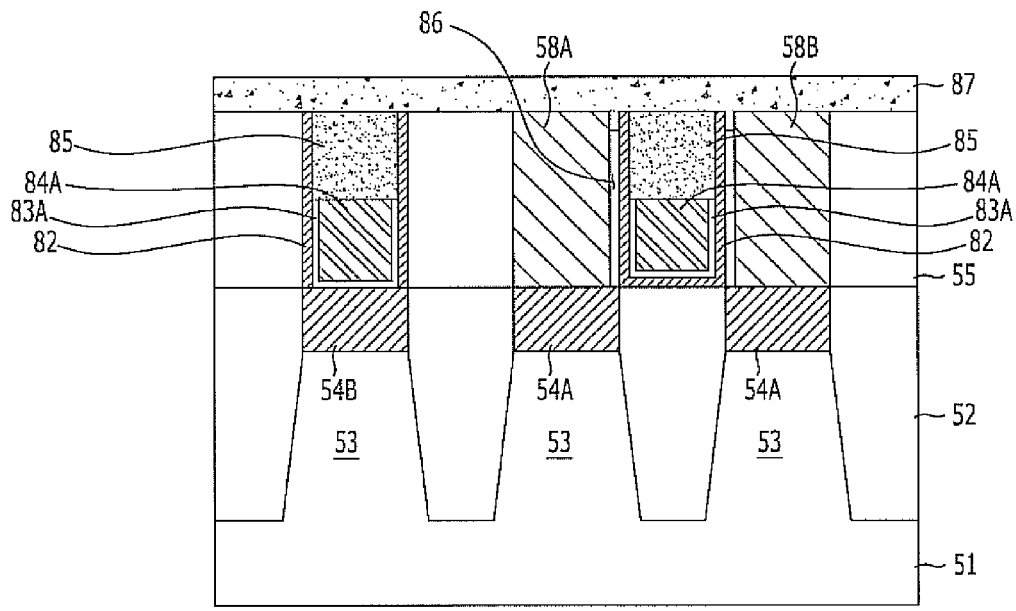

Referring to FIG. 7G, the capping layer 87 is formed over the substrate structure. The capping layer 87 prevents the lifting of the bit lines 84A due to the air gap 86. The capping layer 87 may be a nitride layer such as a silicon nitride layer. The capping layer 87 hermetically seals the upper portion of the air gap 86.

According to the fifth exemplary embodiment of the present invention, there is an air gap 86 between the storage node contact plugs 58A and 58B and the bit lines 84A. Since the air gap 86 is formed between the storage node contact plugs 58A and 58B and the bit lines 84A, the parasitic capacitance between the storage node contact plugs 58A and 58B and the bit lines 84A is decreased.

Figure 8A:
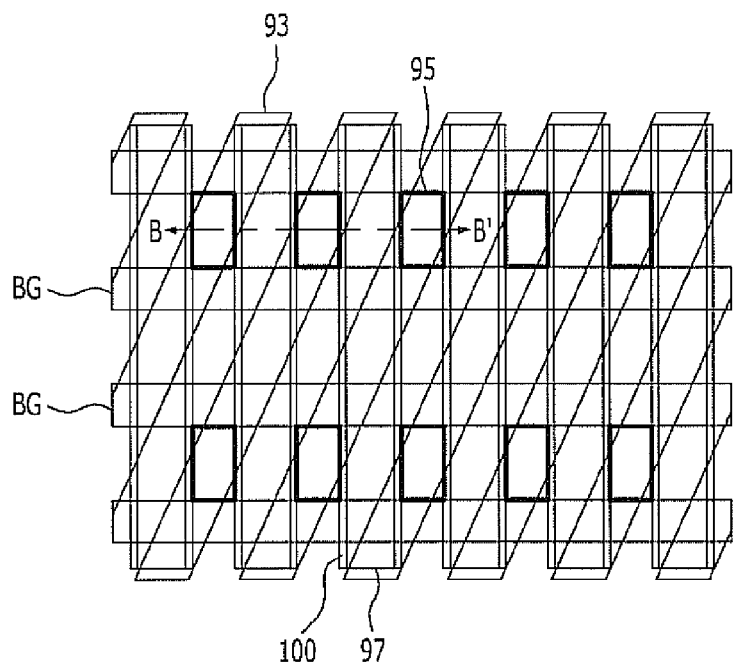
FIG. 8A is a plan view of a semiconductor device in accordance with a sixth exemplary embodiment of the present invention.
Figure 8B:
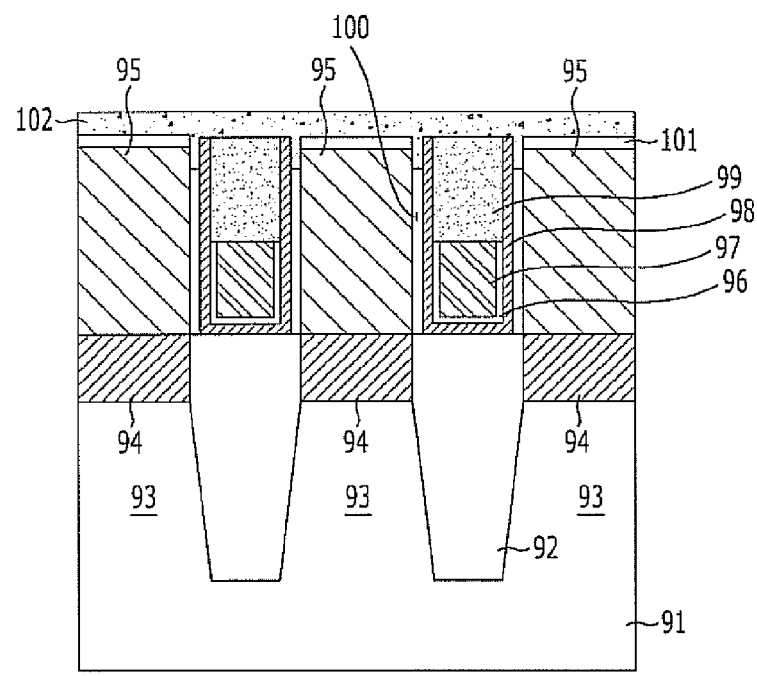
FIG. 8B is a cross-sectional view of the semiconductor device of FIG. 8A taken along a line B-B'.

FIG. 8A is a plan view of a semiconductor device in accordance with a sixth exemplary embodiment of the present invention, and FIG. 8B is a cross-sectional view of the semiconductor device of FIG. 8A taken along a line B-B'.

Referring to FIGS. 8A and 8B, an isolation layer 92 is formed over a semiconductor substrate 91. The isolation layer 92 defines active regions 93. Landing plugs 94 are formed over the active regions 93. Over the landing plugs 94, storage node contact plugs 95 are formed. The storage node contact plugs 95 are isolated by bit lines 97. The bit lines 97 are formed by etching the storage node contact plugs 95 to thereby form a damascene pattern, and then filling the inside of the damascene pattern. Therefore, the bit lines 97 are referred to as damascene bit lines. A bit line hard mask layer 99 is formed over the bit lines 97. A barrier layer 96 is formed on the sidewalls and bottom surfaces of the bit lines 97.

An air gap 100 and a spacer 98 are formed between the bit lines 97 and the storage node contact plugs 95. The spacer 98 includes a silicon nitride layer, a silicon oxide layer, a tungsten oxide layer, or a stacked structure including a combination of these layers. As for a method of forming the air gap 100 and the spacer 98, any one among the first to fifth exemplary embodiments can be referred to. In FIG. 8A, the gates formed in the upper and lower portions of buried gates (BG) are gates of an isolation transistor for isolating adjacent cells from each other.

The storage node contact plugs 95 may be formed of a polysilicon layer or a tungsten layer. A hard mask pattern 101 is formed over the storage node contact plugs 95. A capping layer 102 for hermetically sealing the upper portion of the air gap 100 is also formed. Although not illustrated in FIG. 8B, landing plugs to contact the bit lines 97 are formed over the active regions 93, and buried gates are formed in a direction crossing the active regions 93.

According to the sixth exemplary embodiment, the air gap 100 and the spacer 98 are between the storage node contact plugs 95 and the bit lines 97. The parasitic capacitance between the storage node contact plugs 95 and the bit lines 97 may be decreased by forming the air gap 100 between the storage node contact plugs 95 and the bit lines 97.

In the first to sixth exemplary embodiments described above, in addition to titanium nitride and tungsten oxide, an aluminum oxide ($Al_2O_3$) layer or a silicon (Si) layer may be used as a material for forming a sacrificial spacer, which is removed to form the air gap.

According to exemplary embodiments of the present invention described above, parasitic capacitance may be decreased due to a low dielectric rate of an air gap formed between bit lines and storage node contact plugs.

Therefore, a DRAM device which could not be previously realized due to a limitation in storage capacitance Cs may now be obtained for use in small-sized semiconductor devices. Also, when it is applied to a device having a certain storage capacitance Cs, a sensing margin may be increased to thereby improve device characteristics and throughput.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a plurality of first conductive patterns separated by a damascene pattern;
a second conductive pattern buried in the damascene pattern; and
a spacer comprising an air gap between the second conductive pattern and the first conductive patterns,
wherein the spacer further comprises a first spacer and a second spacer, and the air gap is disposed between the first spacer and the second spacer,
wherein the first spacer comprises a silicon nitride layer and the second spacer comprises an oxide layer.

2. The semiconductor device of claim 1, further comprising:
a capping layer configured to hermetically seal an upper portion of the air gap.

3. The semiconductor device of claim 1, wherein the spacer further comprises a silicon nitride layer.

4. The semiconductor device of claim 1, wherein the oxide layer comprises a silicon oxide layer or a tungsten oxide layer.

5. The semiconductor device of claim 1, wherein the first conductive patterns comprise storage node contact plugs, and the second conductive pattern comprises a bit line.

6. The semiconductor device of claim 5, wherein the storage node contact plugs comprise a polysilicon layer or a tungsten layer.

7. The semiconductor device of claim 1, wherein the spacer further comprises a bottom surface that extends underneath the second conductive pattern.

* * * * *